US008994100B2

(12) United States Patent
Matsumoto

(10) Patent No.: US 8,994,100 B2
(45) Date of Patent: Mar. 31, 2015

(54) SEMICONDUCTOR DEVICE INCLUDING SOURCE AND DRAIN OFFSET REGIONS

(71) Applicant: Renesas Electronics Corporation, Kawasaki-shi, Kanagawa (JP)

(72) Inventor: Hiroki Matsumoto, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/765,502

(22) Filed: Feb. 12, 2013

(65) Prior Publication Data
US 2013/0256792 A1  Oct. 3, 2013

(30) Foreign Application Priority Data
Mar. 27, 2012 (JP) ................ 2012-071077

(51) Int. Cl.
| H01L 29/66 | (2006.01) |
| H01L 29/78 | (2006.01) |
| H01L 27/088 | (2006.01) |
| H01L 29/423 | (2006.01) |

(52) U.S. Cl.
CPC .......... *H01L 29/7827* (2013.01); *H01L 27/088* (2013.01); *H01L 29/4236* (2013.01); *H01L 29/7834* (2013.01)
USPC ........... 257/330; 257/331; 257/332; 257/333; 257/334

(58) Field of Classification Search
None
See application file for complete search history.

(56) References Cited

U.S. PATENT DOCUMENTS

| 5,889,293 A * | 3/1999 | Rutten et al. ................ 257/74 |
| 6,118,149 A | 9/2000 | Nakagawa et al. |
| 7,157,782 B1 * | 1/2007 | Shih et al. ................ 257/530 |
| 8,053,820 B2 | 11/2011 | Hashitani |
| 2005/0001265 A1 | 1/2005 | Shiraki et al. |
| 2007/0224767 A1 * | 9/2007 | Lin et al. ................ 438/301 |
| 2008/0073731 A1 * | 3/2008 | Hayashi ................ 257/409 |
| 2008/0169493 A1 * | 7/2008 | Lee et al. ................ 257/296 |

(Continued)

FOREIGN PATENT DOCUMENTS

| EP | 1 295 342 B1 | 3/2003 |
| JP | 11-103058 A | 4/1999 |
| JP | 2003-534665 A | 11/2003 |

(Continued)

OTHER PUBLICATIONS

Japanese Office Action for related Japanese Application No. 2012-071077, mailed Dec. 2, 2014.

*Primary Examiner* — Mamadou Diallo
*Assistant Examiner* — Jay C Chang
(74) *Attorney, Agent, or Firm* — Miles & Stockbridge P.C.

(57) ABSTRACT

The present invention provides a semiconductor device designed to prevent an electric field from being concentrated in the vicinity of a groove portion. The semiconductor includes a semiconductor layer, a source region, a drain region, a source offset region, a drain offset region, a groove portion, a gate insulating film, a gate electrode, and an embedded region. The groove portion is provided in at least a position between the source offset region and the drain offset region in the semiconductor layer in a plan view, in a direction from the source offset region to the drain offset region in a plan view. The gate insulating film covers a side and a bottom of the groove portion. The gate electrode is provided only within the groove portion in a plan view, and contacts the gate insulating film.

16 Claims, 30 Drawing Sheets

(56) References Cited

U.S. PATENT DOCUMENTS

2009/0140332 A1* 6/2009 Kim .............................. 257/330
2010/0181641 A1* 7/2010 Blank ........................... 257/520
2010/0327345 A1* 12/2010 Kawaguchi .................. 257/330

FOREIGN PATENT DOCUMENTS

| JP | 2005-026664 A | 1/2005 |
|---|---|---|
| JP | 2009-206144 A | 9/2009 |
| JP | 2011-071233 A | 4/2011 |

* cited by examiner

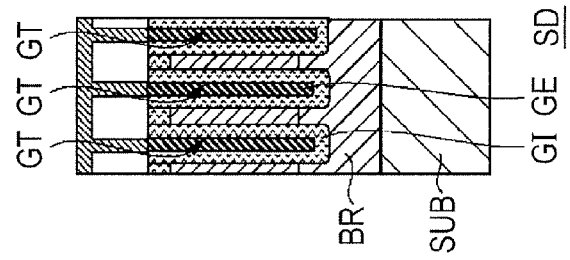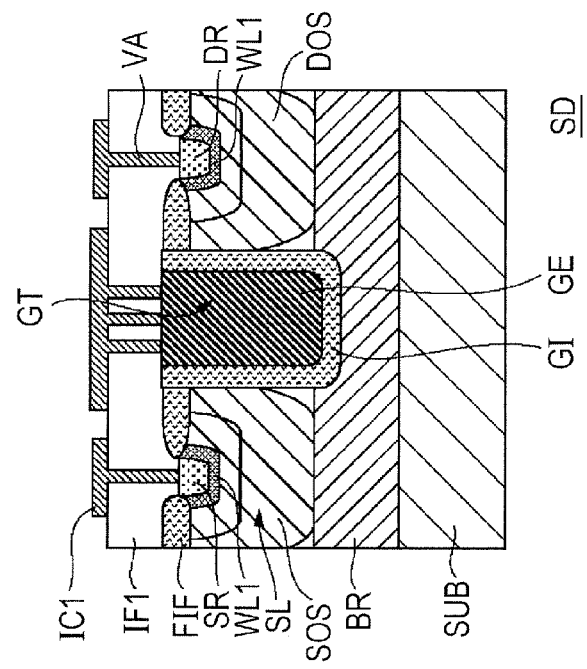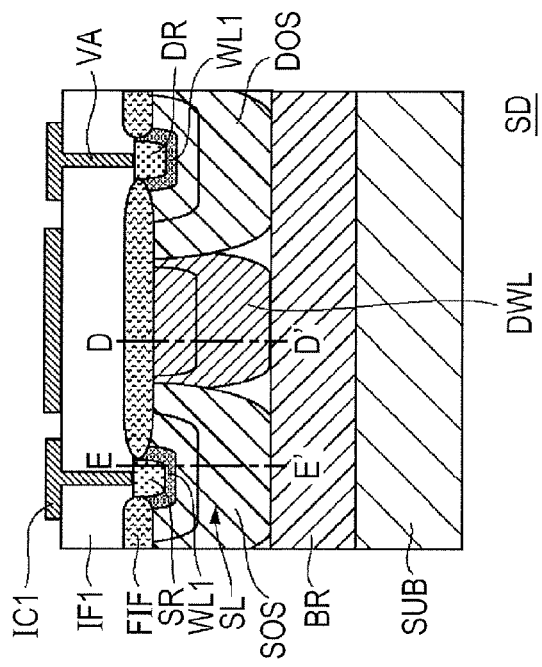

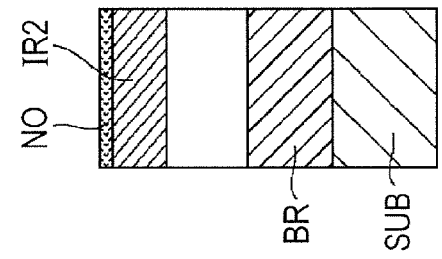
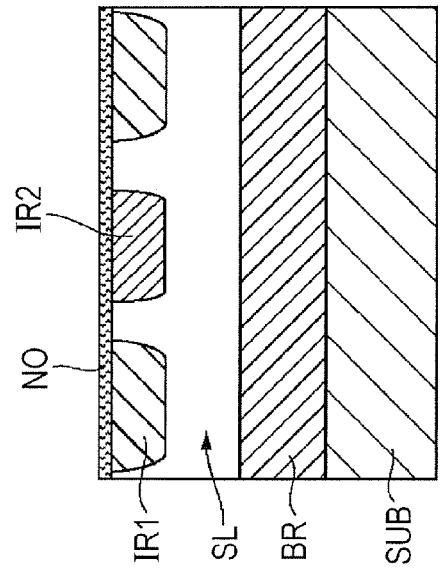
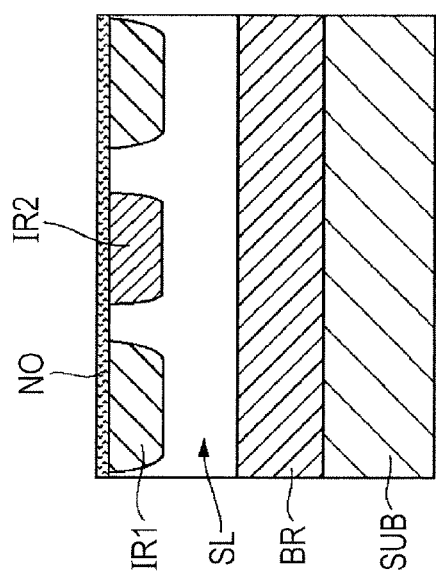

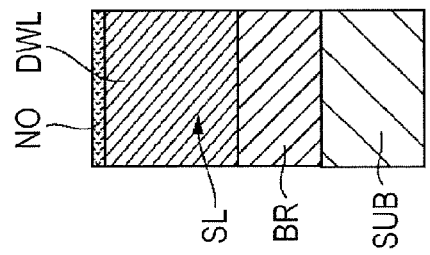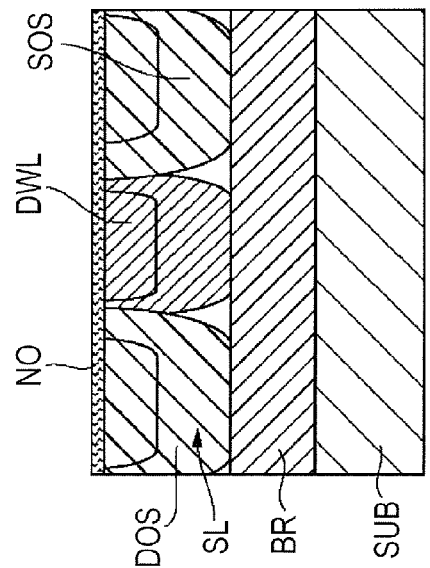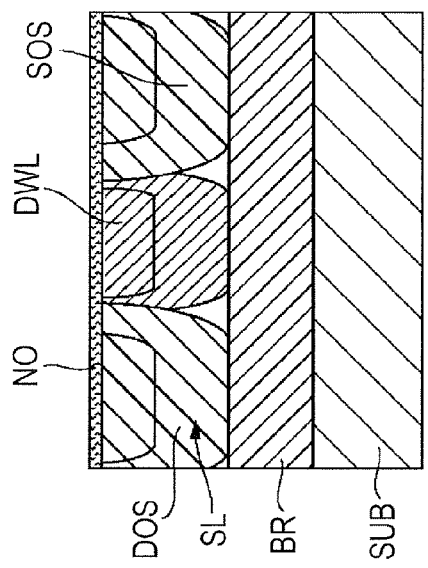

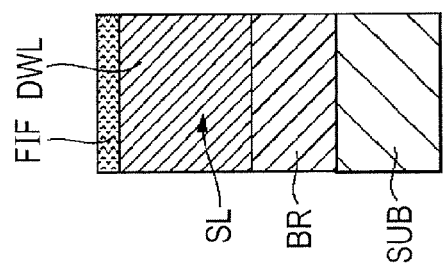
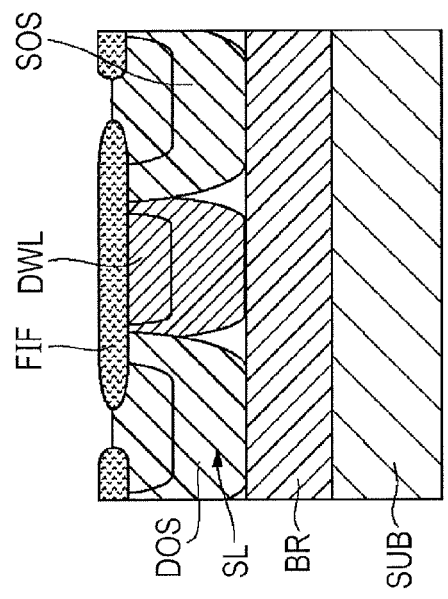
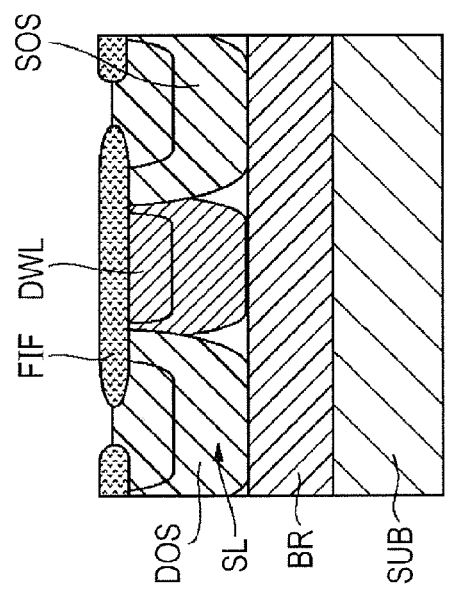

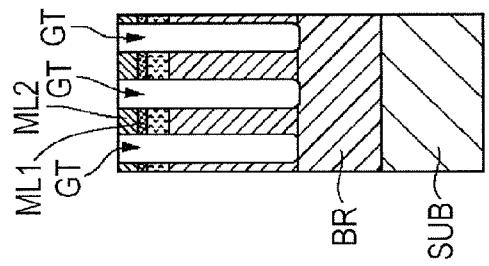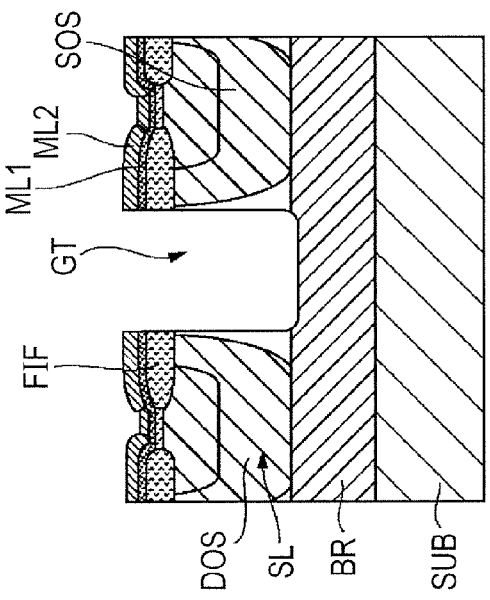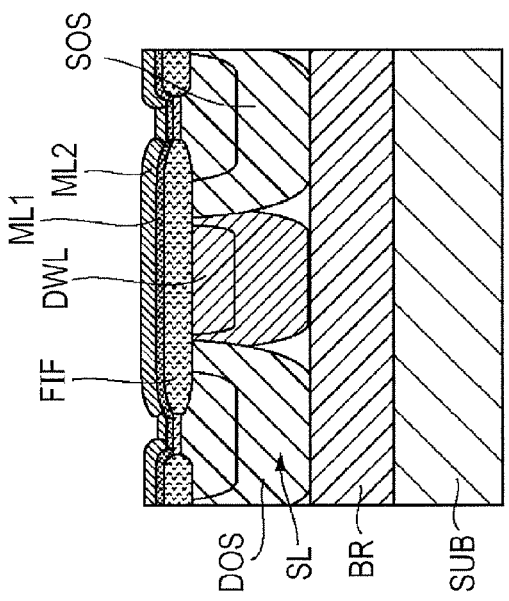

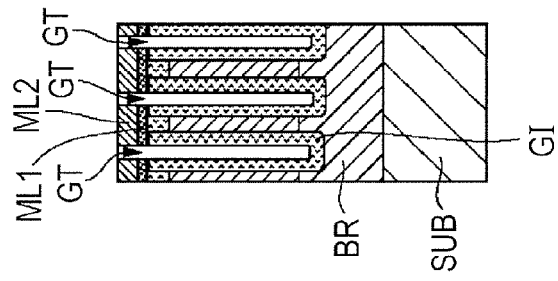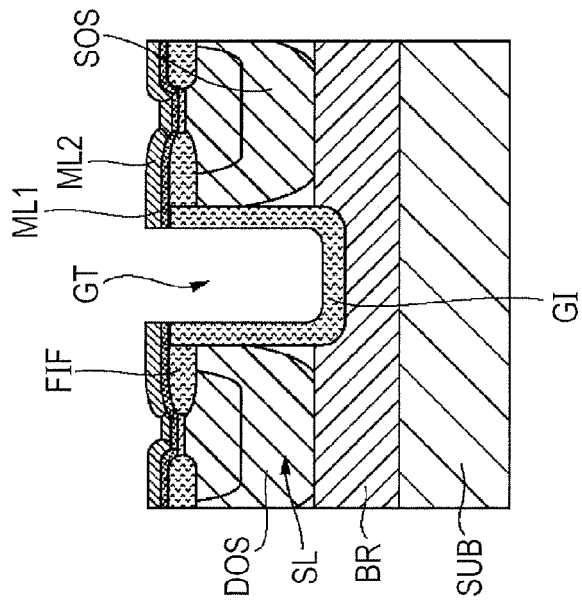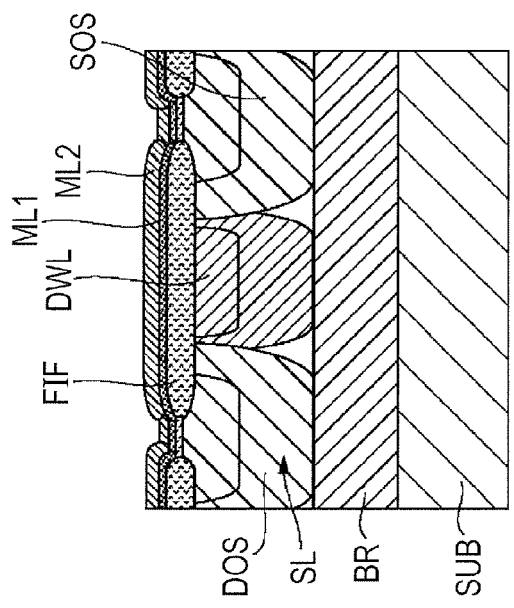

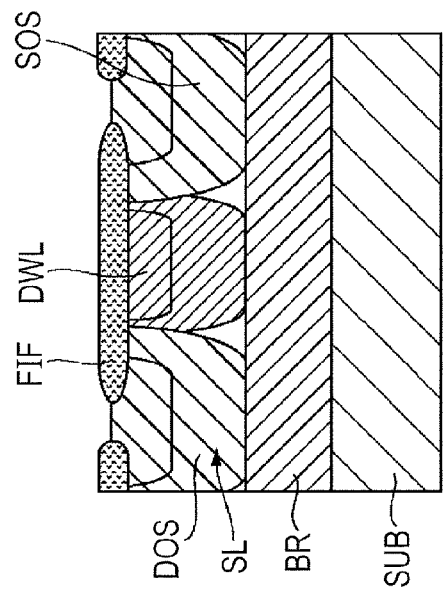
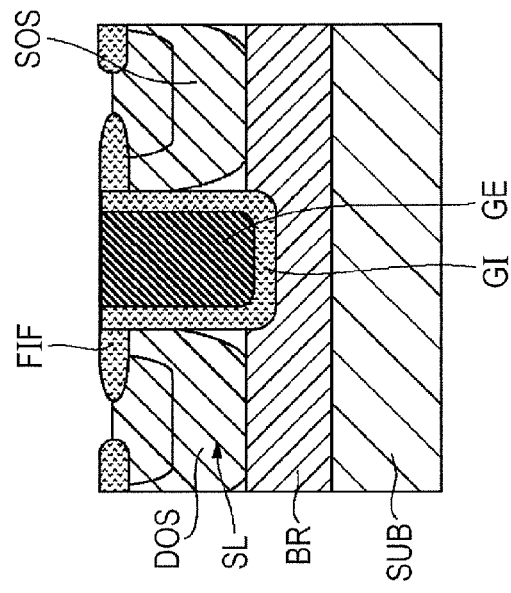
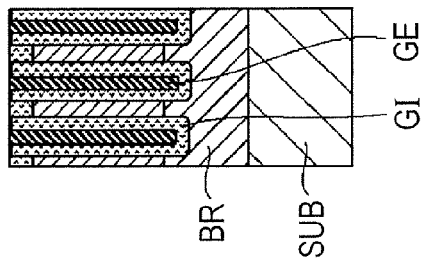

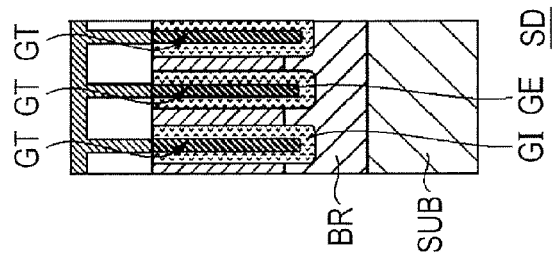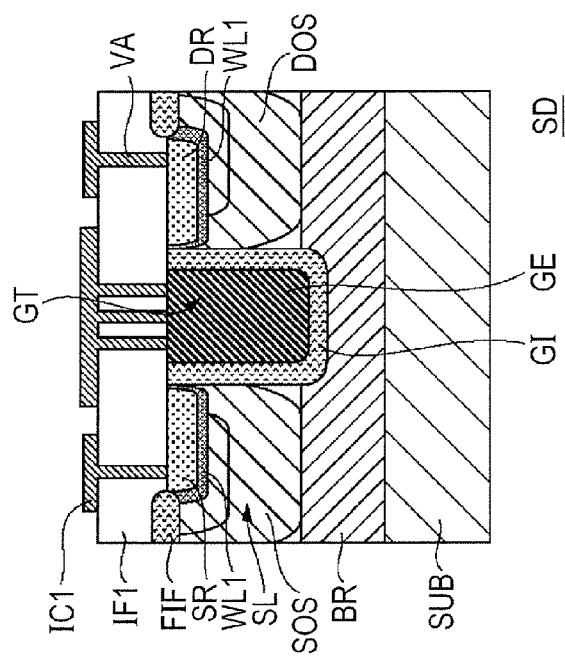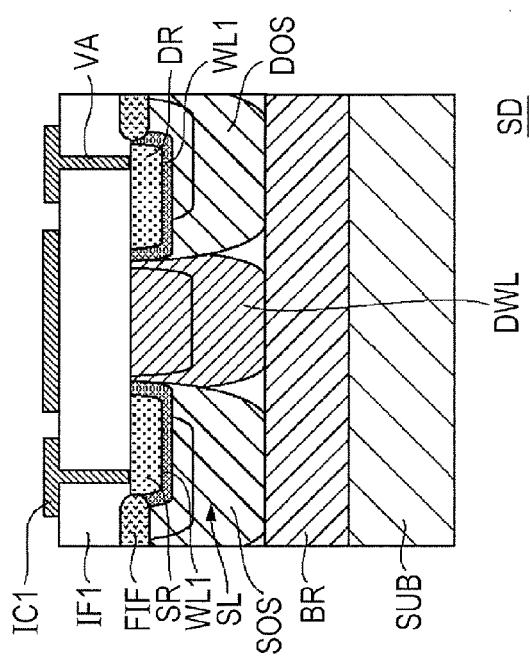

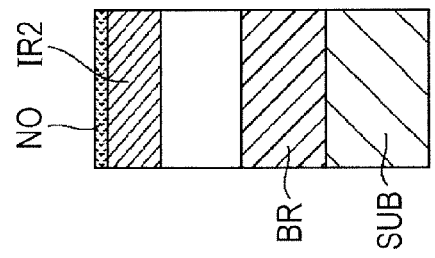
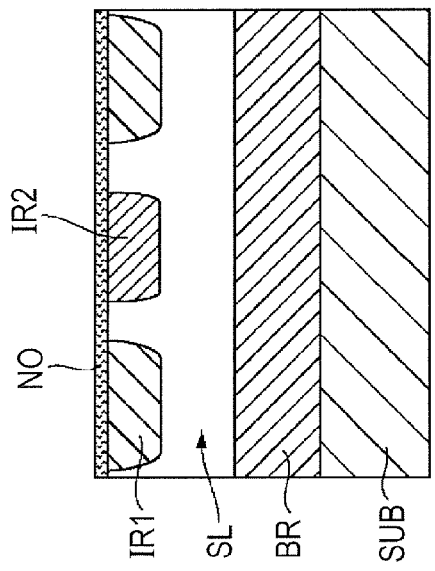
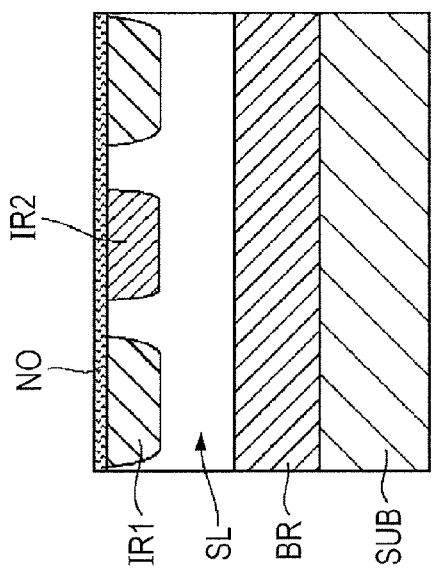

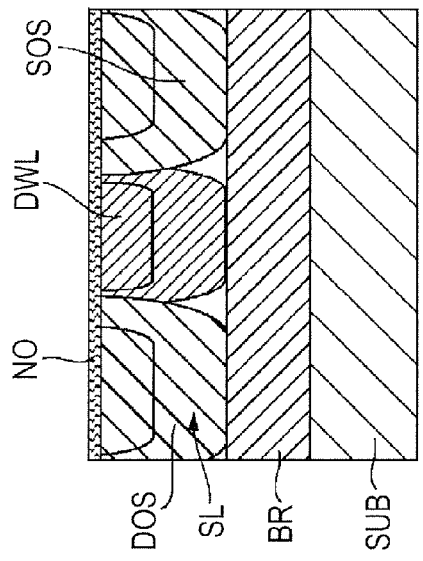
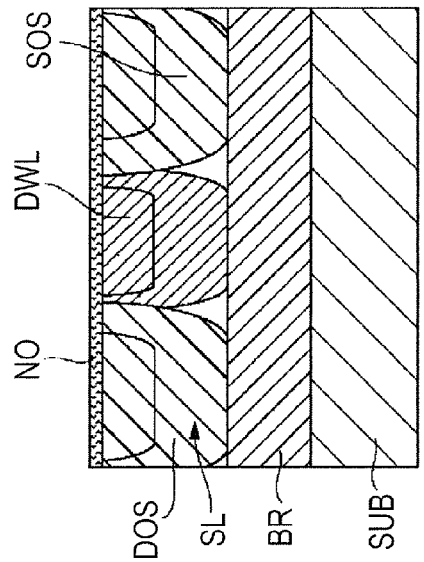
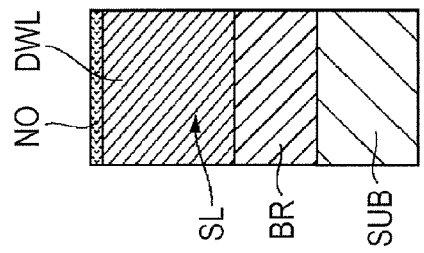

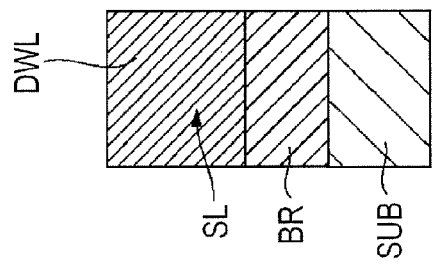
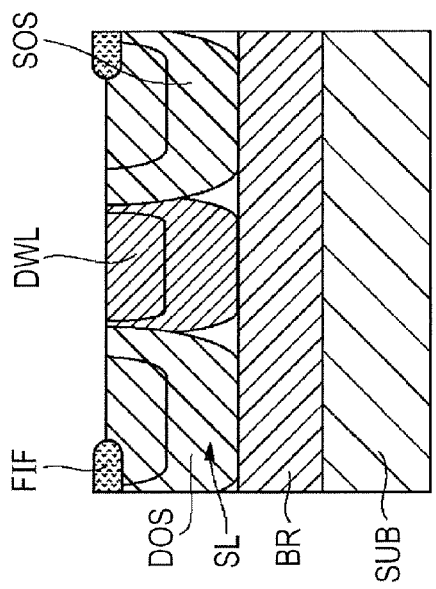
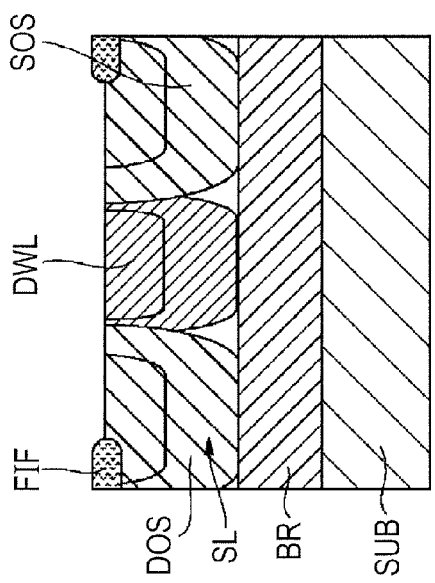

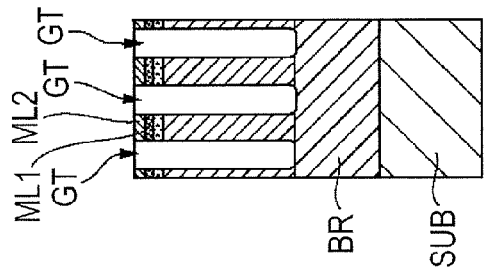
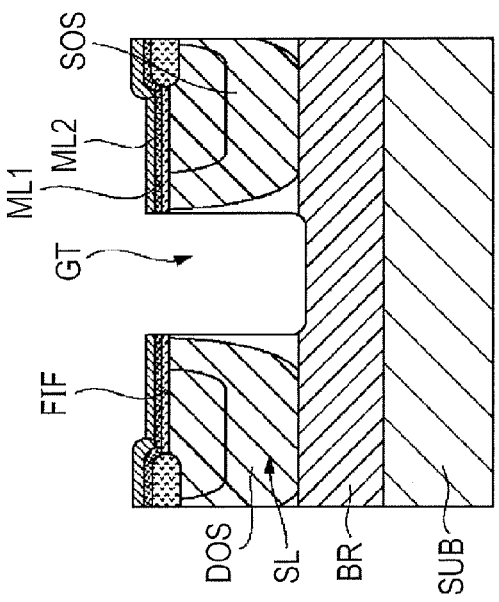
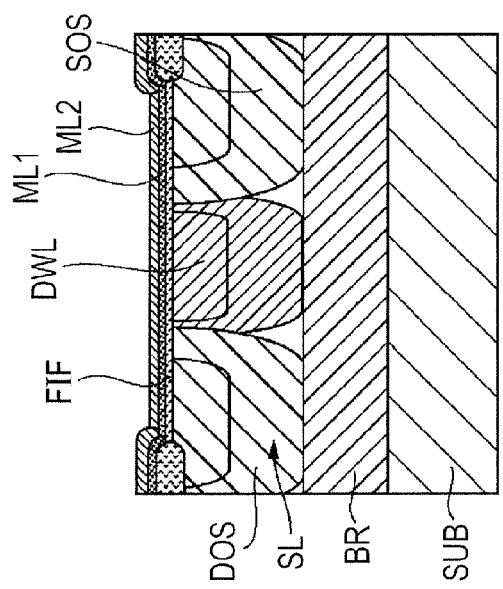

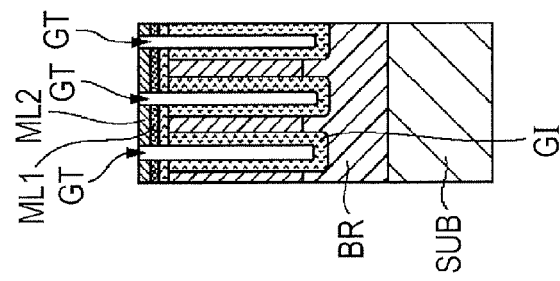
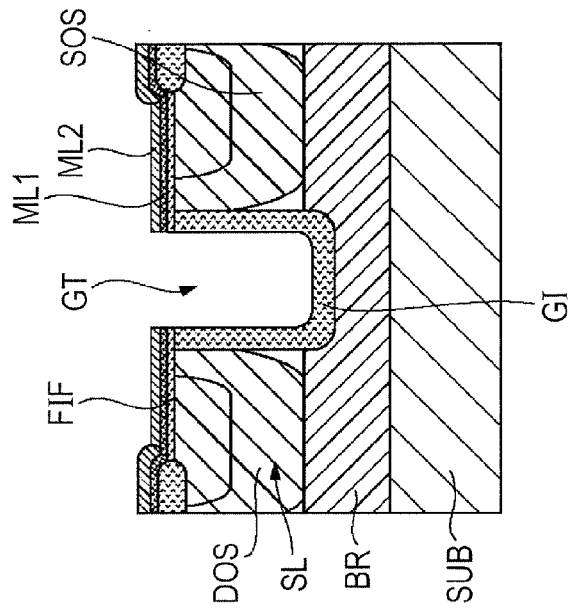
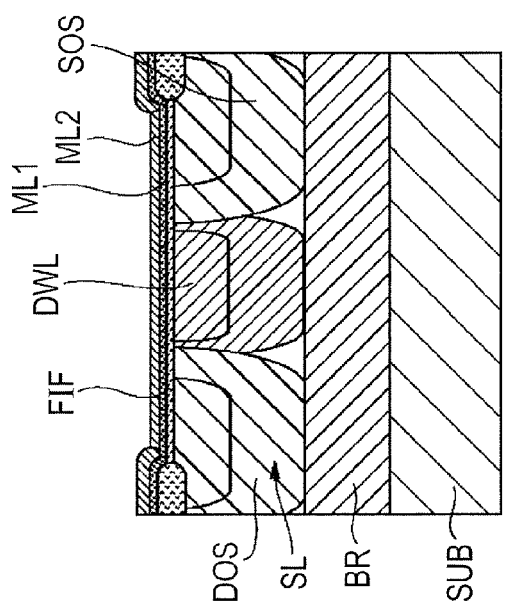

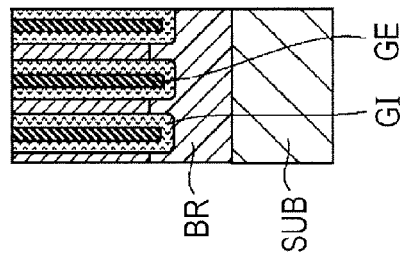
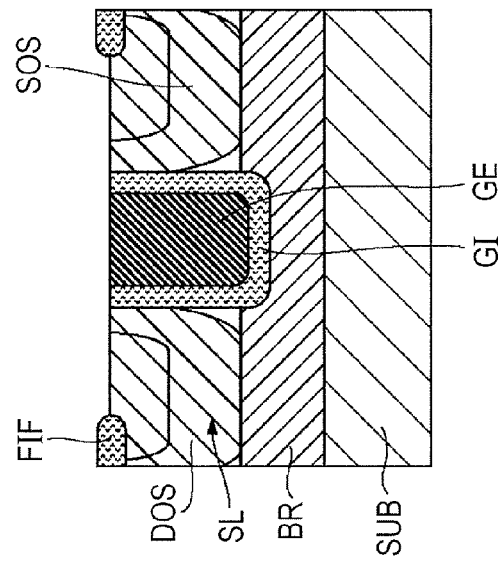
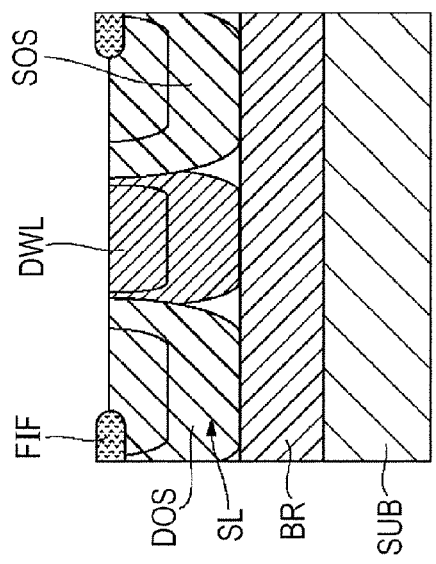

SEMICONDUCTOR DEVICE INCLUDING SOURCE AND DRAIN OFFSET REGIONS

CROSS-REFERENCE TO RELATED APPLICATIONS

The disclosure of Japanese Patent Application No. 2012-071077 field on Mar. 27, 2012 including the specification, drawings and abstract is incorporated herein by reference in its entirety.

BACKGROUND

The present invention relates to a semiconductor device.

With the recent integration of semiconductor devices, the reduction of the area occupied by the semiconductor device is desired.

Japanese Unexamined Patent Publication No. Hei 11 (1999)-103058 describes the following semiconductor device. A trench (groove portion) is formed on the surface of an N-type high resistance layer. A gate electrode is embedded in the trench through a gate insulating film. In this way, the area of a channel can be increased with the device area unchanged. As a result, it is possible to reduce the ON resistance.

SUMMARY

The inventors have found a new problem that in the structure of Japanese Unexamined Patent Publication No. Hei 11 (1999)-103058, it is difficult to obtain a high breakdown voltage due to a high electric field in the vicinity of the end of a groove portion. Other objects, advantages and novel features of the present invention will be apparent from the following detailed description and attached drawings of the present invention.

According to an aspect of the present invention, there is provided a semiconductor device including a semiconductor layer, a source region, a drain region, a source offset region, a drain offset region, a groove portion, a gate insulating film, a gate electrode, and an embedded region. The source and drain regions of a first conductivity type are provided separately from each other in the semiconductor layer. The source offset region of the first conductivity type is formed to contact the source region of the semiconductor layer, with a lower concentration than those of the source region and the drain region. The drain offset region of the first conductivity type is formed to contact the drain region of the semiconductor layer while being separated from the source offset region, with a lower concentration than those of the source region and the drain region. The groove portion is provided in at least a position between the source offset region and the drain offset region in the semiconductor layer in a plan view. The groove portion extends in a direction from the source offset region to the drain offset region in a plan view. The gate insulating film covers a side and a bottom of the groove portion. The gate electrode is provided only within the groove portion in a plan view, and contacts the gate insulating film. The embedded region of a second conductivity type opposite to the first conductivity type is located deeper than the source region and the drain region.

According to another aspect of the present invention, there is provided a semiconductor device including a semiconductor layer, a source region, a drain region, a source offset region, a drain offset region, a groove portion, a gate insulating film, a gate electrode, and an embedded region. The source and drain regions of a first conductivity type are provided separately from each other in the semiconductor layer. The source offset region of the first conductivity type is formed to contact the source region of the semiconductor layer, with a lower concentration than those of the source and drain regions. The drain offset region of the first conductivity type is formed to contact the drain region of the semiconductor layer while being separated from the source offset region, with a lower concentration than those of the source region and the drain region. The groove portion is provided in at least a position between the source offset region and the drain offset region in the semiconductor layer in a plan view. The groove portion extends in a direction from the source offset region to the drain offset region in a plan view. The gate insulating film covers a side and a bottom of the groove portion. The gate electrode contacts the gate insulating film. The embedded region of a second conductivity type opposite to the first conductivity type is located deeper than the source region and the drain region. The bottom of the groove portion enters the embedded region.

According to the one aspect of the present invention, it is possible to provide a semiconductor device designed to prevent an electric field from being concentrated in the vicinity of the end of the groove portion.

BRIEF DESCRIPTION OF THE DRAWINGS

FIGS. 3A, 3B, and 3C are cross-sectional views of the structure of the semiconductor device according to the first embodiment;

FIGS. 5A, 5B, and 5C are cross-sectional views showing a method of manufacturing the semiconductor device according to the first embodiment;

FIGS. 6A, 6B, and 6C are cross-sectional views showing a method of manufacturing the semiconductor device according to the first embodiment;

FIGS. 7A, 7B, and 7C are cross-sectional views showing a method of manufacturing the semiconductor device according to the first embodiment;

FIGS. 8A, 8B, and 8C are cross-sectional views showing the manufacturing method of the semiconductor device according to the first embodiment;

FIGS. 9A, 9B, and 9C are cross-sectional views showing a method of manufacturing the semiconductor device according to the first embodiment;

FIGS. 11A, 11B, and 11C are cross-sectional views showing a method of manufacturing the semiconductor device according to the first embodiment;

FIGS. 22A, 22B, and 22C are cross-sectional views of the structure of a, semiconductor device according to a second embodiment of the present invention;

FIGS. 24A, 24B, and 24C are cross-sectional views showing a method of manufacturing the semiconductor device according to the second embodiment;

FIGS. 25A, 25B, and 25C are cross-sectional views showing a method of manufacturing the semiconductor device according to the second embodiment;

FIGS. 26A, 26B, and 26C are cross-sectional views showing a method of manufacturing the semiconductor device according to the second embodiment;

FIGS. 27A, 27B, and 27C are cross-sectional views showing a method of manufacturing the semiconductor device according to the second embodiment;

FIGS. 28A, 28B, and 28C are cross-sectional views showing a method of manufacturing the semiconductor device according to the second embodiment;

FIGS. 30A, 30B, and 30C are cross-sectional views showing a method of manufacturing the semiconductor device according to the second embodiment.

DETAILED DESCRIPTION

Figure 1:
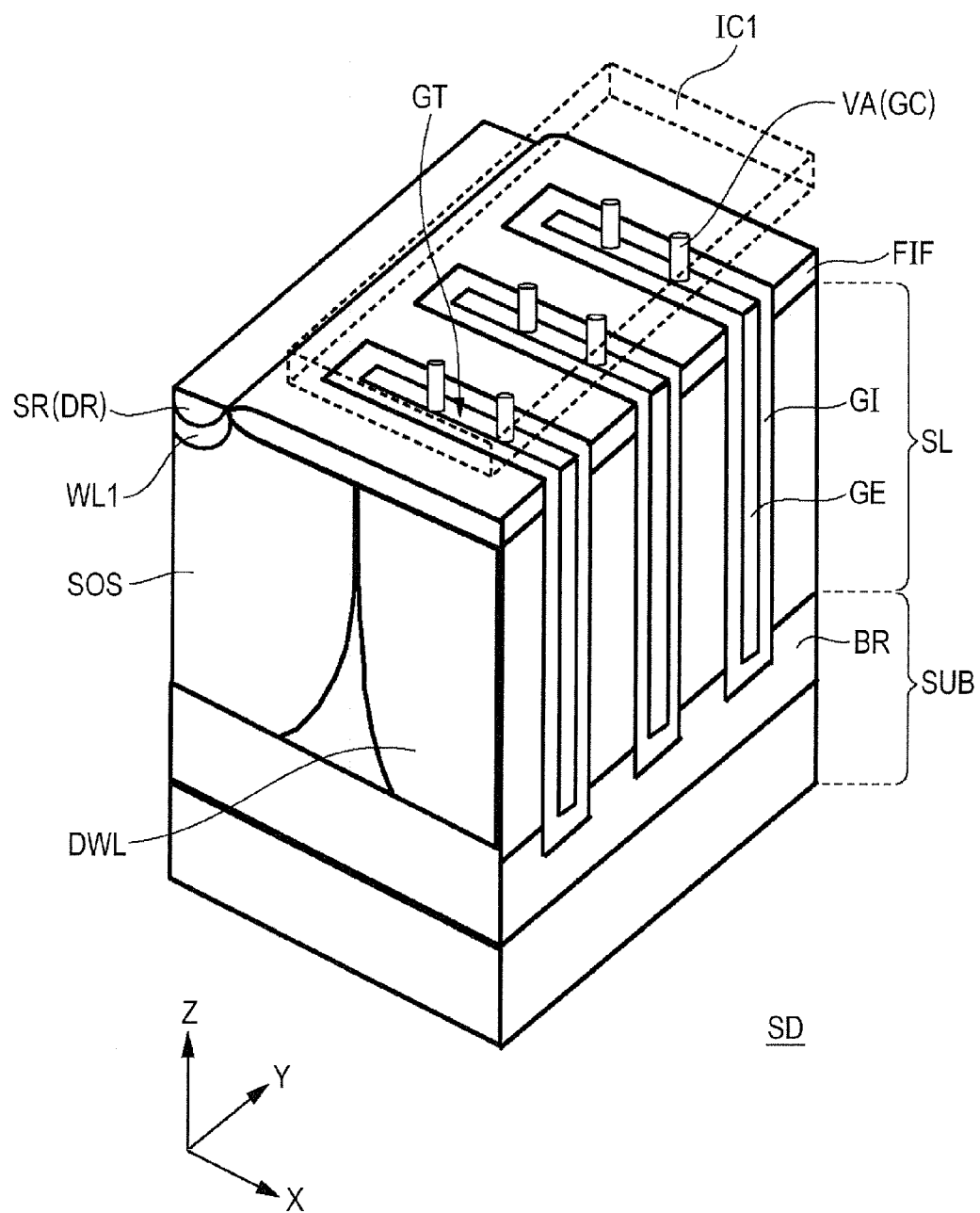
FIG. 1 is a perspective view of the structure of a semiconductor device according to a first embodiment of the present invention.

Hereinafter, embodiments of the present invention will be described with reference to the accompanying drawings. Note that the same components are denoted by the same reference numerals throughout the drawings, and detailed description will be omitted.

First Embodiment

A semiconductor device SD according to a first embodiment will be described with reference to FIGS. 1 to 4C. The semiconductor device SD according to the first embodiment includes a semiconductor layer SL, a source region SR, a drain region DR, a source offset region SOS, a drain offset region DOS, a groove portion GT, a gate insulating film GI, a gate electrode GE, and an embedded region BR. The source region SR and the drain region DR, which are of a first conductivity type, are provided separately from each other in the semiconductor layer SL. The source offset region SOS of the first conductivity type contacts the source region SR of the semiconductor layer SL. The source offset region SOS is formed with a lower concentration than those of the source region SR and the drain region DR. The drain offset region DOS of the first conductivity type contacts the drain region DR of the semiconductor layer SL, and is separated from the source offset region SOS. The drain offset region DOS is formed with a lower concentration than those of the source region SR and the drain region DR. The groove portion GT is provided in at least a position between the source offset region SOS and the drain offset region DOS in the semiconductor layer SL in a plan view. The groove portion GT extends in the direction from the source offset region SOS to the drain offset region DOS in a plan view. The gate insulating film GI covers the side and bottom of the groove portion GT. The gate electrode GE is provided only within the groove portion GT in a plan view, and contacts the gate insulating film GI. The embedded region BR of a second conductivity type opposite to the first conductivity type is located deeper than the source region SR and the drain region DR. The details of the first embodiment will be described below.

In the following description, it is assumed that the "first conductivity type" is P type, and the "second conductivity type" is N type. However, the first embodiment is not limited to this example, and it is also possible that the "first conductivity type" is N type and the "second conductivity type" is P type.

First, the outline of the semiconductor device SD will be described with reference to FIG. 1. FIG. 1 is a perspective view of the structure of the semiconductor device SD according to the first embodiment. As shown in FIG. 1, the semiconductor layer SL is provided on a semiconductor substrate SUB. The semiconductor substrate SUB is, for example, a P-type silicon substrate.

The N-type embedded region BR is provided in the semiconductor substrate SUB. The embedded region BR is formed in a position at least deeper than the upper surface of the semiconductor substrate SUB. Here, the embedded region BR is formed on the upper layer side of the semiconductor substrate SUB.

The semiconductor layer SL is formed by epitaxial growth on the semiconductor substrate SUB. The semiconductor layer SL is, for example, a P-type silicon layer formed by the epitaxial growth. In this way, since the semiconductor layer SL is formed by the epitaxial growth, it is possible to form the N-type embedded region BR in a position deep enough not to form the embedded region BR by ion implantation from the upper surface of the semiconductor layer SL.

As shown in FIG. 1, the semiconductor layer. SL includes the source region SOS, a P-type well region WL1, a source offset region SOS, which are formed by implanting a P-type impurity, as well as an n-type well region (N-type deep well region DWL) formed by implanting an N-type impurity. In the region not shown, the drain region DR, the P-type well region WL1, and the drain offset region DOS, which are formed by implanting a P-type impurity, are located in a symmetrical position across the N-type deep well region DWL.

A field insulating film FIF is provided between the source region SR and the drain region DR in the vicinity of the surface layer of the semiconductor layer SL in a plan view. The field insulating film FIF is formed, for example, by a local oxidation of silicon (LOCOS) process. In this way, the field insulating film FIF can be easily formed by inexpensive equipment. Note that it is also possible to form the field insulating film FIF by a shallow trench isolation (STI) process.

The groove portion GT is provided within the field insulating film FIF in a plan view. As described below, it is possible to increase the breakdown voltage of the semiconductor device SD by providing the field insulating film FIF, in addition to the source offset region SOS and the drain offset region DOS.

Further, the groove portion GT is provided, for example, in the normal direction (Z-axis direction) of the semiconductor substrate SUB. A plurality of groove portions GT are arranged at regular intervals in the direction (the Y direction in FIG. 2) in which the source region SR (or the drain region DR) extends. The gate insulating film GI is formed on the side and bottom of the groove portion GT. The gate electrode GE is embedded in the groove portion GT to contact the gate insulating film GI. Thus, the groove portion GT forms a gate electrode structure.

A contact via VA (also referred to as a contact plug) is provided in a position overlapping the gate electrode GE. A line IC1 is coupled to the gate electrode through the contact via VA. For example, in the first embodiment, the line IC1 coupled to the gate electrode GE is formed extending in the X direction in the figure. Note that the source region SR and the drain region DR are coupled to the line IC1 through the via VA that is provided in the region not shown.

Figure 2:
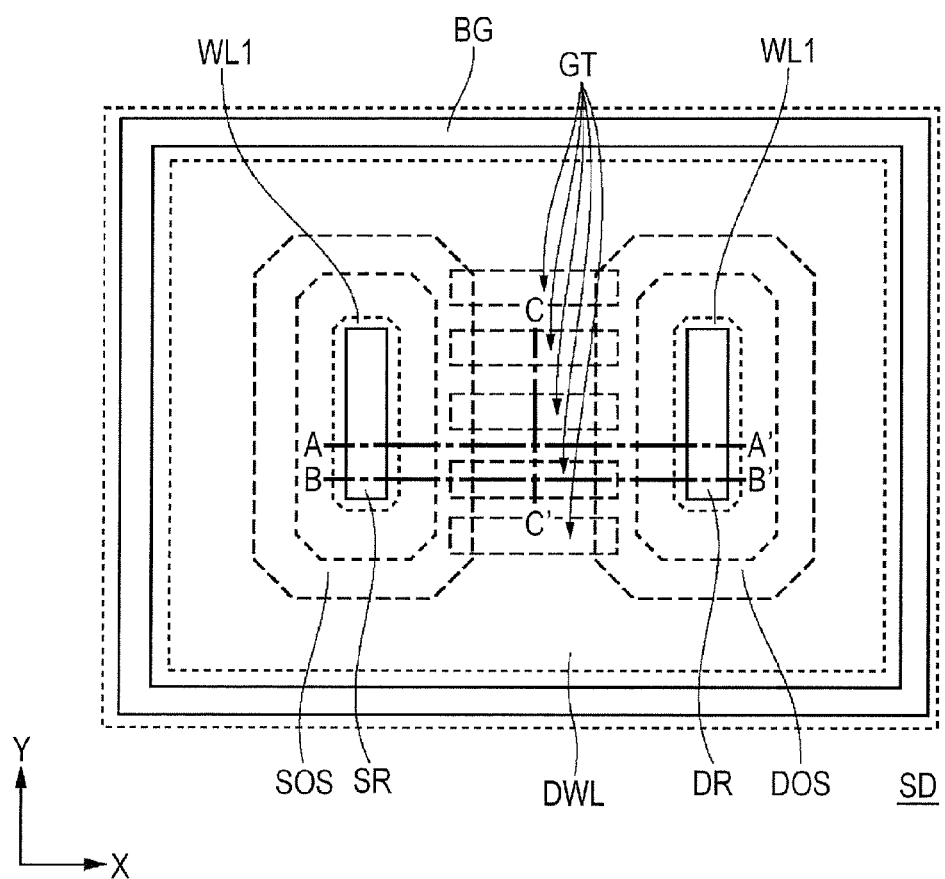
FIG. 2 is a plan view of the structure of the semiconductor device according to the first embodiment.

FIG. 2 is a plan view of the structure of the semiconductor device SD according to the first embodiment. FIGS. 3A, 3B, and 3C are cross-sectional views of the structure of the semiconductor device according to the first embodiment. FIG. 3A is a cross-sectional view taken along line A-A' of FIG. 2, FIG. 3B is a cross-sectional view taken along line B-B' of FIG. 2, and FIG. 3C is a cross-sectional view taken along line C-C' of FIG. 2. As shown in FIG. 2, the P-type source region SR and the P-type drain region DR are formed separately from each other in the X direction of the semiconductor layer SL in a plan view. Further, the gate electrodes GE formed in the groove portions GT are arranged parallel to each other. For example, the P-type impurity implanted into the source region SR and the drain region DR is boron (B).

The P-type well region WL1 is provided so as to overlap the source region SR and the drain region DR in a plan view, respectively. Each of the source region SR and the drain region DR is formed surrounded by the P-type well region WL1 in the semiconductor layer. At the same time, each of the source region SR and the drain region DR is formed within the P-type well region WL1 in a plan view. For example, the same impurity as that of the source region SR and the drain region DR is implanted into the P-type well region WL1.

The P-type source offset region SOS contacts the source region SR of the semiconductor layer SL. Here, the source region SR is formed surrounded by the source offset region SOS in the semiconductor substrate. At the same time, the source region SR is formed within the source offset region SOS in a plan view. Further, the source offset region SOS contacts the source region SR through the P-type well region WL1 in the semiconductor substrate. The source offset region SOS is formed with a lower concentration than those of the source region SR and the drain region DR.

The P-type drain offset region DOS contacts the drain region DR of the semiconductor layer SL. Here, the drain region DR is formed surrounded by the drain offset region DOS in the semiconductor substrate. At the same time, the drain region DR is formed within the drain offset region DOS in a plan view. Further, the drain offset region DOS contacts the drain region DR through the P-type well region WL1 in the semiconductor substrate. The drain offset region DOS is formed separately from the source offset region SOS. The drain offset region DOS is formed with a lower concentration than those of the source region SR and the drain region DR. For example, the P-type impurity implanted into the source offset region SOS and the drain offset region DOS is boron (B).

The N-type deep well region DWL formed by implanting the N-type impurity is located between the source offset region SOS and the drain offset region DOS (in the X direction) in a plan view. The region adjacent to the gate insulating film GI of the N-type deep well region DWL in the depth direction of the groove portion GT (in the downward z-direction in FIG. 1) is a so-called channel region. The region adjacent in the Y direction to the gate insulating film GI formed on the side surface of the groove portion GT in the N-type deep well region DWL between the source offset region SOS and the drain offset region GOS, acts as the so-called channel region.

The groove portion GT is provided in at least a position between the source offset region SOS and the drain offset region DOS in the semiconductor layer SL in a plan view. The gate insulating film GI and the gate electrode GE are provided within the groove portion GT to form a gate electrode structure.

The groove portion GT may enter the source offset region SOS or the drain offset region DOS in a plan view. As described below, the channel region of the N-type deep well region DWL is formed extending in the depth direction of the groove portion GT between the source offset region SOS and the drain offset region DOS. Note that it is preferable that the groove portion GT does not contact the source region SR and the drain region DR.

As shown in FIG. 2, the groove portion GT is provided in the direction from the source offset region SOS to the drain offset region DOS in a plan view. Note that "the direction from the source offset region SOS to the drain offset region DOS" is the A-A' direction in the figure (X direction). Further, the groove portion GT is provided between the source region SR and the drain region DR in a plan view. In other words, it is preferable that the side surface of the groove portion GT is parallel to the direction to which the electric field is applied.

A plurality of groove portions GT are provided separately from each other in the direction (Y direction) perpendicular to the direction from the source region SR to the drain region DR. Here, for example, the groove portions GT are provided at regular intervals. By providing the groove portions GT in this way, it is possible to increase the area of the channel region without increasing the plane area of the device.

For example, the source region SR and the drain region DR are provided in a symmetrical position across the groove portion GT. Note that the groove portion GT may be provided close to either one of the two impurity regions.

The width of the groove portion GT in the direction (Y direction) perpendicular to the direction from the source region SR to the drain region DR is preferably, for example, 0.5 μm or more and 5 μm or less. More preferably, the width is 0.8 μm or more and 1.2 μm or less. Further, the width of the particular groove portion GT is, for example, equal to or more than the diameter of the contact via VA.

The interval of the groove portion GT is, for example, 0.5 μm or more and 5 μm or less. More preferably, the interval of the particular groove portion GT is 0.8 μm or more and 2.0 μm or less. Further, the interval of the particular groove portion GT is, for example, equal to or more than the width of the groove portion GT described above.

The groove portion GT has, for example, a rectangular shape in a plan view. The end portion of the groove portion GT may have a curved surface in a plan view. In other words, the groove portion GT may be oval shaped in a plan view. Note that the side surface of the groove portion GT is preferably a straight line in a plan view.

As described above, the source region SR, the source offset region SOS, the drain region DR, the drain offset region DOS, the gate insulating film GI, and the gate electrode GE form a field effect transistor (FET). A plurality of FETs may be provided, and may be symmetrically arranged in a staggered pattern. In this case, a second gate electrode GE is located in a symmetrical position with respect to a first gate electrode GE across a first drain region DR in a plan view. A second source region SR is located in a symmetrical position with respect to the first drain region DR across the second gate electrode GE in a plan view.

An N-type back gate region BG is formed to surround the FET forming region in a plan view. In order to stabilize the potential of the channel region, the N-type back gate region BG is fixed, for example, to the power voltage. When a plurality of EFTs are provided as described above, the N-type back gate region BG is formed to surround the outside of the region in which a logical circuit including the FETs is formed. Note that an N-type well region (not shown) may also be provided below a position overlapping the N-type back gate region BG in a plan view.

FIGS. 3A, 3B, and 3C are cross-sectional views of the structure of the semiconductor device according to the first embodiment. FIG. 3A is a cross-sectional view taken along line A-A' of FIG. 2.

As shown in FIG. 3A, the N-type embedded region BR is provided on the upper layer side of the semiconductor substrate SUB. The N-type embedded region. BR is located deeper than the source region SR and the drain region DR. The N-type impurity introduced into the N-type embedded region BR is, for example, antimony (Sb). The N-type embedded region BR is provided to surround the FET forming region in a plan view. The N-type embedded region BR is electrically coupled, for example, to the N-type back gate region BG.

The semiconductor layer SL is formed on the semiconductor substrate SUB. Thus, the interface is formed between the semiconductor substrate SUB and the semiconductor layer SL. The thickness of the semiconductor layer SL is, for example, 1 μm or more and 20 μm or less. Further, the thickness of the semiconductor layer SL is preferably, for example, 5 μm or more and 10 μm or less.

Further, as described above, the semiconductor layer SL includes the P-type source region SR, the P-type well region WL1, the P-type source offset region SOS, the N-type deep well region DWL, the P-type drain region DR, the P-type well region WL1, and the P-type drain offset region DOS.

For example, both the P-type source offset region SOS and the P-type drain offset region DOS contact the N-type embedded region BR. Further, for example, the N-type deep well region DWL contacts the N-type embedded region BR.

The N-type well region (the N-type deep well region DWL) is provided in at least a position between the source offset region SOS and the drain offset region DOS in the semiconductor layer SL in a plan view. Further, the N-type deep well region DWL is formed so as to overlap the groove portion GT of the semiconductor layer SL in a cross-sectional view. Here, the N-type embedded region BR is formed with a higher concentration than that of the N-type deep well region DWL. The impurity concentration of the N-type embedded region BR is higher than that of the impurity of the channel region of the N-type deep well region DWL. This configuration can ensure that the electric field is constantly prevented from being concentrated in the area in which the groove portion GT enters the N-type embedded region BR as described below.

The field insulating film FIF is provided between the source region SR and the drain region DR in the semiconductor layer SL in a plan view. The field insulating film FIF is formed in a position overlapping the channel region of the semiconductor layer SL in a plan view. The field insulating film FIF is formed on the source offset region SOS, the N-type deep well region DWL, and the drain offset region DOS. The source region SR and the drain region DR are formed in an opening (no reference numeral) of the field insulating film FIF.

Further, as shown in FIG. 3A, an interlayer insulating film IF1 is formed on the field insulating film FIF and the semiconductor layer SL. The interlayer insulating film IF1 is, for example, $SiO_2$, SiON, SiOC, SiOCH, SiCOH, or SiOF.

The thickness of the field insulating film FIF is, for example, 0.2 μm or more and 1 μm or less.

The contact via VA is provided in a position overlapping the source region SR or the drain region DR of the interlayer insulating film IF1 in a plan view. The contact via VA contacts the source region SR or the drain region DR.

A plurality of lines IC1 are provided on the interlayer insulating film IF1. Each of the lines IC1 is coupled to the source region SR or the drain region DR through the contact via VA.

Here, the contact via VA and the line IC1 are formed integrally. For example, the contact via VA and the line IC1 includes Al. However, note that the contact via VA and the line IC1 may be formed from different materials. The contact via VA or the line IC1 may be, for example, Cu or W. In addition, a barrier metal (not shown) may be provided on the side and bottom of the contact via VA, as well as on the bottom and top of the line IC1.

FIG. 3B is a cross-sectional view taken along line B-B' of FIG. 2. As shown in FIG. 3B, the groove portion GT is provided between the source offset region SOS and the drain offset region DOS in a plan view. The groove portion GT is provided through the field insulating film FIF that is provided between the source region SR and the drain region DR.

The gate insulating film GI is provided on the side and bottom of the groove portion GT. The gate insulating film GI includes, for example, a thermal silicon oxide film. The gate insulating film GI is formed by thermally oxidizing the gate insulating film GI in order to prevent pin holes from being formed on the side and bottom of the groove portion GT. Note that the gate insulating film GI may include a plurality of layers.

The thickness of the gate insulating film GI is, for example, 100 nm or more and 1 μm or less. Preferably the thickness of the gate insulating film GI is, for example, 300 nm or more and 500 nm or less. For example, the bottom of the groove portion GT is formed to a depth twice or more the thickness of the gate insulating film GI from the upper surface of the semiconductor substrate SUB.

The gate electrode GE contacts the gate insulating film GI. Here, the groove portion GT is filled with the gate electrode GE. Further, the gate electrode GE is provided only within the groove portion GT in a plan view. The gate electrode GE does not stick out of the groove portion GT in a plan view. In other words, the gate electrode GE is not integrally formed from the inside of the groove portion GT in a position outside the groove portion GT in a plan view. The gate electrode GE is configured such that the upper end portion of the gate electrode GE does not extend to the surface of the semiconductor layer SL in a plan view. In the vicinity of the surface of the semiconductor layer SL, the upper end portion of the gate electrode GE is provided in a position inside the upper end of the groove portion so that the gate electrode GE does not extend to a position overlapping the source offset region SOS, the drain offset region DOS, and the N-type deep well region DWL in a plan view. In this way, it is possible to prevent the electric field from being concentrated in the vicinity of the upper end of the groove portion GT as described below.

The gate electrode GE is formed in a position below the top of the field insulating film FIF. The upper end of the gate electrode GE may be located above the top of the semiconductor layer SL. Note that the upper surface of the gate electrode GE and the upper surface of the field insulating film FIF may not form a single surface.

The gate electrode GE is, for example, polysilicon. The particular polysilicon gate electrode GE is formed by the chemical vapor deposition (CVD) method. In this way, the gate electrode GE can be embedded in the groove portion GT in a stable manner.

The groove portion GT is provided within the field insulating film FIF in a plan view. In other words, the opening (no reference numeral) of the field insulating film FIF is formed separately from the groove portion GT. In other words, the source region SR and the drain region DR are formed separately from the gate electrode GE. In this way, it is possible to achieve high voltage FET. However, it is also possible that only the drain region DR is formed separately from the gate electrode GE.

The bottom of the groove portion GT enters the N-type embedded region BR. Here, the bottom of the groove portion GT is formed in a deep position from the upper surface of the semiconductor substrate SUB. In this way, the area in which the bottom of the particular groove portion GT enters the embedded region BR does not function as the P-type channel region, which will be described below. Thus, it is possible to prevent the electric field from being concentrated in the area in which the bottom of the particular groove portion GT enters the embedded region BR.

The corner on the lower end side of the groove portion GT may has an R shape. Here, for example, the corner on the lower end portion side of the groove portion GT is shaped like an R by thermally oxidizing the gate insulating film GI. Note that the particular corner may be a right angle.

As shown in FIG. 3B, the interlayer insulating film IF1 is provided on the semiconductor layer SL, the field insulating film FIF, and the gate electrode GE. The contact via VA is provided on the interlayer insulating film IF1 in a position overlapping the gate electrode GE in a plan view. The contact via VA contacts the gate electrode GE. It is also possible that a plurality of contact vias VA contact the gate electrode GE provided in a single groove portion GT. The line IC1 is provided on the interlayer insulating film IF1 in a position overlapping the gate electrode GE in a plan view. The particular line IC1 is coupled to the gate electrode GE through the contact via VA.

FIG. 3C is a cross-sectional view taken along line C-C' of FIG. 2. As shown in FIG. 3C, in the first embodiment, the region that contacts the side surface of the groove portion GT, which extends to the top of the embedded region BR from the upper surface of the semiconductor layer SL, is the channel region. A plurality of groove portions GT are provided in the direction (C-C' direction) perpendicular to the direction from the source region SR to the drain region DR. For example, the groove portions GT are arranged at equal intervals in this direction. With this structure, the area of the channel region can be increased without increasing the plane area of the semiconductor device SD. In other words, it is possible to reduce the ON resistance of the semiconductor device SD.

As shown in FIG. 3C, the gate electrode GE does not stick out of the groove portion GT in a plan view, also in the direction perpendicular to the direction from the source region SR to the drain region DR.

A plurality of contact vias VA are provided also in the C-C' direction. Each of the contact vias VA contacts the gate electrode GE within each of the groove portions GT. The individual contact vias VA are coupled to a single line IC.

In the region not shown, a plurality of line layers may also be formed on the interlayer insulating layer IF1 and the line IC1. In other words, a multilayer interconnection structure may be formed. For example, a bump electrode (not shown) or Cu pillar (not shown) may be formed on the topmost layer of the multilayer interconnection structure.

Figure 12:
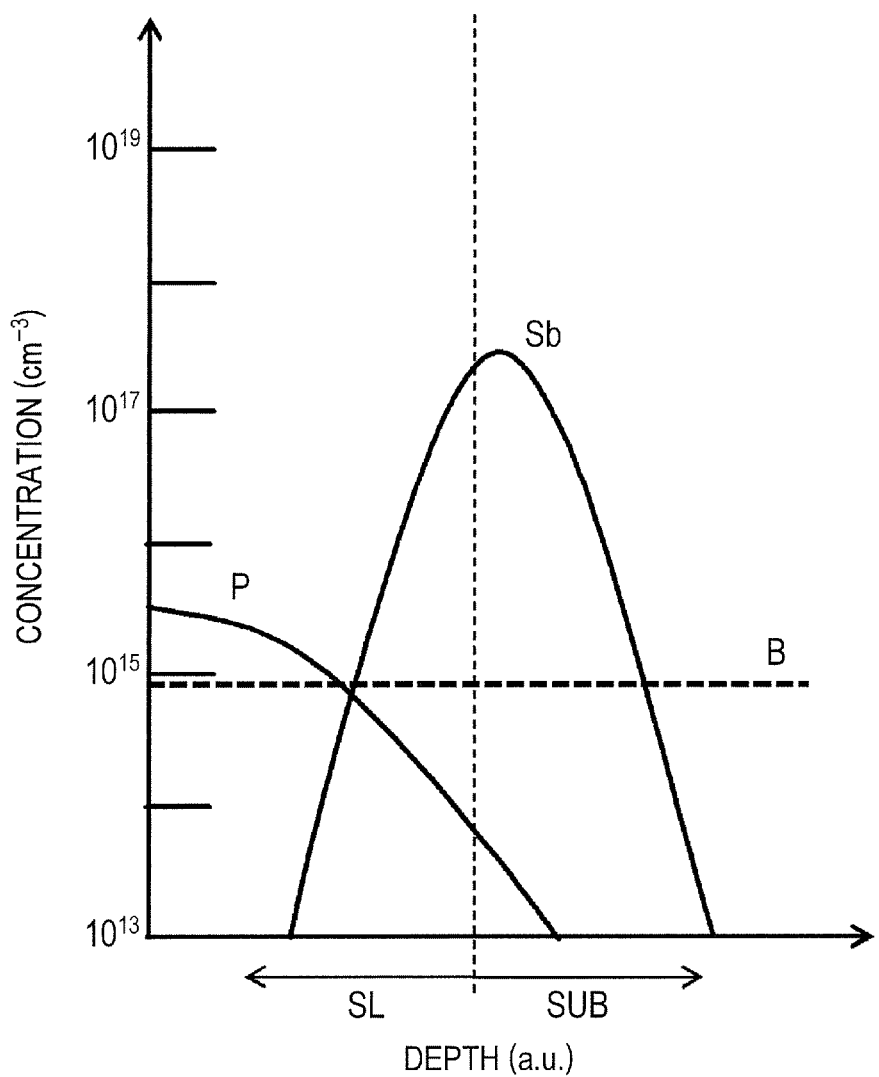
FIG. 12 is an impurity concentration profile of a cross section taken along line D-D' of FIG. 3A.
Figure 13:
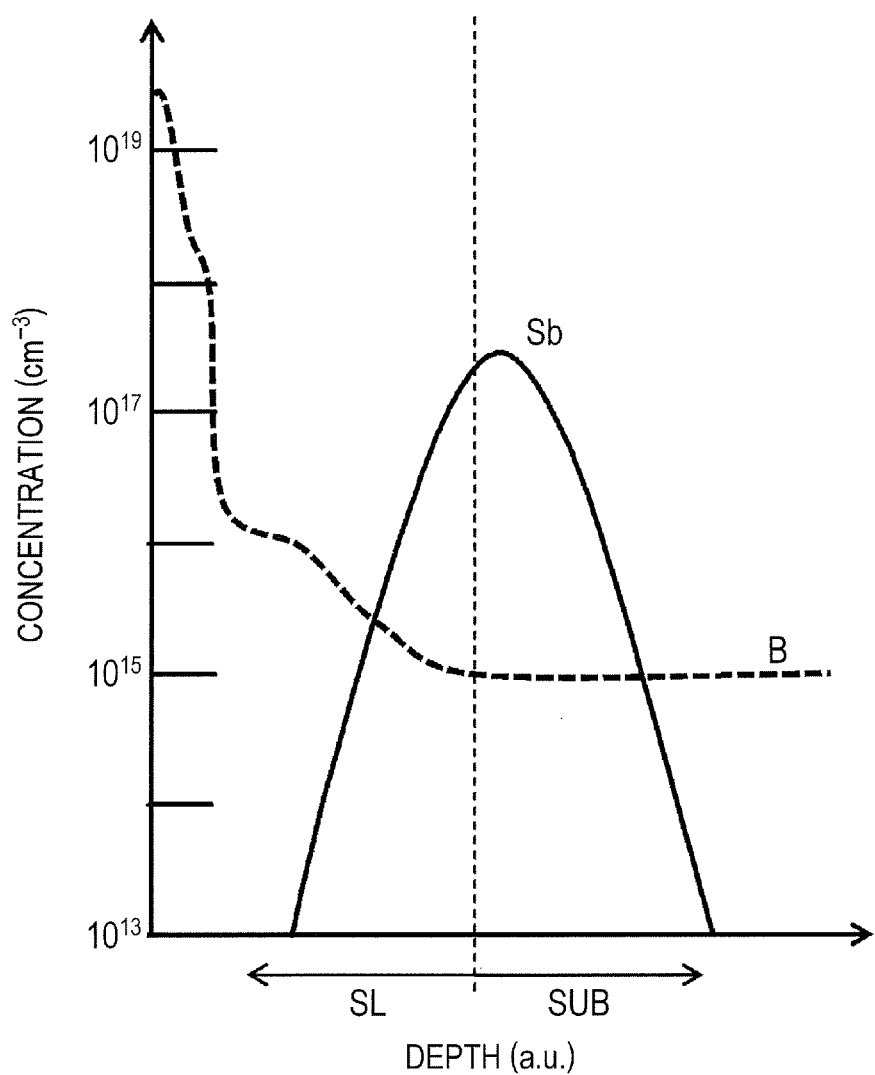
FIG. 13 is an impurity concentration profile of a cross section taken along line E-E' of FIG. 3A.

Next, the impurity concentration in the semiconductor device SD according to the first embodiment will be described with reference to FIGS. 12 and 13. FIG. 12 is an impurity concentration profile of the cross section taken along line D-D' in FIG. 3A. FIG. 13 is an impurity concentration profile of the cross section taken along line E-E' in FIG. 3A. In FIGS. 12 and 13, the N-type impurity is shown by the solid line and the P-type impurity is shown by the dashed line.

As shown in FIG. 12, for example, phosphorus (P) is introduced into the N-type deep well region DWL as the N-type impurity. Further, for example, antimony (Sb) is introduced into the N-type embedded region BR as the N-type impurity. Note that impurities other than P and Sb may also be introduced into each of the impurity regions.

In the figure, the dashed line parallel to the vertical axis shows the interface between the semiconductor substrate SUB and the semiconductor layer SL. The right side of the dashed line is the side of the semiconductor substrate SUB, while the left side of the dashed line is the side of the semiconductor layer SL.

As shown in FIG. 12, the N-type embedded region BR is formed with a higher concentration than that of the N-type deep well region DWL. The peak value of the impurity concentration of the N-type embedded region BR is at least one digit higher than the peak value of the impurity concentration of the deep well region DWL. Further, the P-type impurity concentration of the N-type embedded region BR is preferably at least higher than the P-type impurity concentration of the semiconductor substrate SUB.

More specifically, for example, the peak value of the impurity concentration of the N-type deep well region DWL is $1 \times 10^{15}$ cm$^{-3}$ or more and $5 \times 10^{16}$ cm$^{-3}$ or less. On the other hand, the peak value of the impurity concentration of the N-type embedded region BR is at least $1 \times 10^{17}$ cm$^{-3}$ or more.

As described above, the bottom of the groove portion GT enters the N-type embedded region BR. At this time, since the N-type embedded region BR is formed with a higher concentration than that of the N-type deep well region DWL, the area in which the bottom of the particular groove portion GT enters the embedded region BR does not function as an inversion layer. For this reason, it is possible to prevent the electric field from being concentrated in the particular area.

Further, the impurity introduced into the N-type embedded region BR may also diffuse into the semiconductor layer SL from the side of the semiconductor substrate SUB. On the surface layer side of the semiconductor layer SL, the impurity concentration of Sb, which is introduced into the N-type embedded region BR, is preferably lower than the impurity concentration introduced into the N-type deep well region DWL. As described above, the N-type impurity introduced into the embedded region BR is Sb, so that the impurity may not easily diffuse into the semiconductor layer SL from the side of the semiconductor substrate SUB.

As shown in FIG. 13, the semiconductor layer SL includes the P-type source region SR, the P-type well region WL1, and the source offset region SOS. The peak value of the impurity concentration of the P-type source region SR is at least two digits higher than the peak value of the impurity concentration of the P-type source offset region SOS. The peak value of the impurity concentration of the P-type source region SR is, for example, at least $1 \times 10^{18}$ cm$^{-3}$ or more. The peak value of the impurity concentration of the P-type well region WL1 is, for example, $1 \times 10^{17}$ cm$^{-3}$ or more and $1 \times 10^{19}$ cm$^{-3}$ or less. Further, the peak value of the impurity concentration of the source offset region SOS is $1 \times 10^{18}$ cm$^{-3}$ or more and $5 \times 10^{18}$ cm$^{-3}$ or less. Note that the P-type drain region DR, the P-type well region WL1, and the drain offset region DOS have the same distribution as the source region SR and the like.

Figure 14:
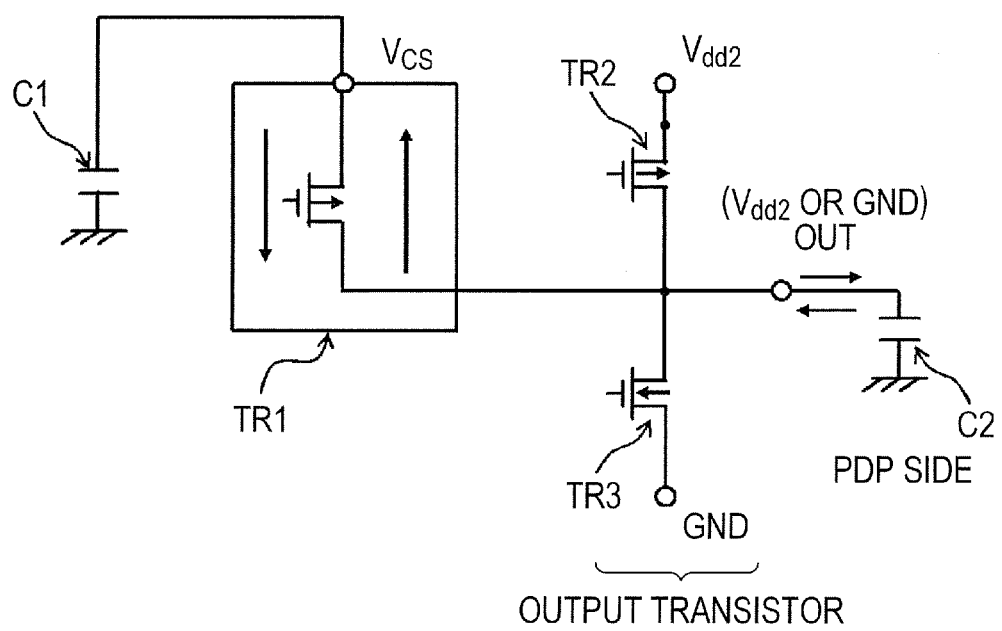
FIG. 14 is a circuit diagram of an example of the semiconductor device according to the first embodiment.

Next, the circuit in the semiconductor device SD according to the first embodiment will be described with reference to FIG. 14. FIG. 14 is a circuit diagram of an example of the semiconductor device SD according to the first embodiment.

The semiconductor device SD according to the first embodiment is, for example, a data driver IC of a plasma display panel (PDP). The PDP data driver IC has a function of outputting a data pulse according to the display data of the PDP panel. More specifically, for example, the semiconductor device SD includes at least a charge collection transistor TR1 of the PDP data driver IC.

As shown in FIG. 14, the semiconductor device SD includes, for example, a charge collection capacitor C1, a charge collection transistor TR1, output transistors TR2 and TR3, and a display cell C2.

Here, the transistor TR1 has the structure of the first embodiment shown in FIGS. 1 to 3. More specifically, the transistor TR1 includes the first source region SR, the first drain region DR, the source offset region SOS, the drain offset region DOS, and the first gate insulating film GI and the first gate electrode GE provided in the groove portion GT. In this way, since the transistor TR1 has the structure of the FET described above, the current capability can be increased and the breakdown voltage can be increased.

One end of the capacitor C1 is grounded, and the other end thereof is coupled to the transistor TR1. The other end of the transistor TR1 is coupled between the transistor TR2 and the transistor TR3.

As described above, the high breakdown voltage transistor TR1 has the structure of the first embodiment. On the other hand, the transistor TR2 or TR3, as well as transistors (not shown) in other logic circuits have the general structure of metal insulator semiconductor FET (MISFET) without the groove portion formed in it, for example. More specifically, the transistor TR2 or TR3 includes a P-type or N-type second source region (not shown) and a P-type or N-type second drain region (not shown), which are provided separately from each other on the semiconductor layer SL. Further, the transistor TR2 or TR3 also includes a second gate insulating film (not shown) provided on a position between the second source region and the second drain region, and a second gate electrode (not shown) provided on the second gate insulating film. Here, the transistor TR2 is a p channel transistor, and the transistor TR3 is an n channel transistor.

Note that the transistor TR2 or TR3, as well as transistors in other logic circuits have a lightly doped drain (LDD) structure according to the voltage to be applied.

The transistors TR2 and TR3 are provided in the same semiconductor layer SL as of the transistor TR1, and are provided in a different position from the transistor TR1 in a plan view. In this way, the transistor TR1 having the structure of the first embodiment, as well as the general transistors used for the logic circuit are mounted on the same substrate. As a result, the circuit area can be reduced.

Further, the transistor TR2 and the transistor TR3 are coupled in series. One end of the transistor TR2 is coupled to a power supply voltage $V_{dd2}$, and the other end thereof is coupled to the transistor TR3. The other end of the transistor TR3 is grounded. An output terminal (OUT) is provided between the transistor TR2 and the transistor TR3, and is coupled to the display cell C2.

The transistor TR1 functions as a two-way switch to collect the charge of the display cell C2. By controlling the ON/OFF of the transistor TR1, the charge stored in the display cell C2 of the PDP is collected in the capacitor C1. In this way, the charge stored in the display cell C2 can be collected during a non-light-emission period, and the particular charge can be reused in the next light emitting time.

Further, in order to ensure stable writing to the display pixels of the PDP, it is necessary to provide a high voltage $V_{dd2}$. For example, $V_{dd2}$ is 10 V or more and 60 V or less. Thus, it is particularly effective that the transistor TR1 has the structure of the first embodiment.

When the semiconductor device SD according to the first embodiment is the data driver IC of the PDP as described above, the semiconductor device SD may also has the following structure. The semiconductor substrate SUB is divided into a plurality of semiconductor chips. The semiconductor chip is mounted on a tape-shaped flexible wiring substrate (not shown). A bump electrode of the semiconductor chip is coupled to a line of the flexible substrate. Further, the semiconductor chip is sealed with a sealing resin. As described above, the particular semiconductor device SD may be a so-called tape carrier package (TCP). Further, a line provided in a glass substrate of the PDP and a line of a printed substrate may be coupled through an anisotropic conductive film.

Next, a method of manufacturing the semiconductor device SD according to the first embodiment will be described with reference to FIGS. 3 to 13. FIGS. 4 to 13 are cross-sectional views showing a method of manufacturing the semiconductor device SD according to the first embodiment. The manufacturing method of the semiconductor device SD according to the first embodiment includes the following steps. First, a source offset region SOS and a drain offset region DOS are formed separately from each other in the semiconductor layer SL by introducing a P-type impurity (the offset region forming step). Next, a groove portion GT is formed in at least a position between the source offset region SOS and the drain offset region DOS in the semiconductor layer SL in a plan view, in the direction from the source offset region SOS to the drain offset region DOS in a plan view (the groove portion forming step). Next, a gate insulating film GI is formed on the side and bottom of the groove portion GT. Next, a conductive material is formed on the semiconductor layer SL so as to contact the gate insulating film GI in the groove portion GT. Then, the surface layer of the conductive material is removed to form a gate electrode GE only within the groove portion in a plan view (the gate electrode forming step). Next, a source region SR and a drain region DR are formed by introducing a P-type impurity with a higher concentration than those of the source offset region SOS and the drain offset region DOS, in a position contacting the source offset region SOS of the semiconductor substrate SUB, and in a position contacting the drain region DR and separated from the source offset region SOS, respectively (the source drain region forming step).

Figure 4C:
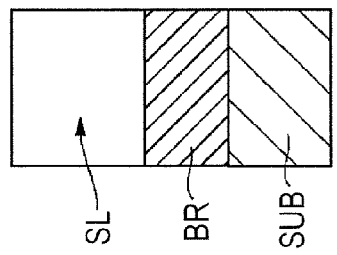
FIGS. 4A, 4B, and 4C are cross-sectional views showing a method of manufacturing the semiconductor device according to the first embodiment.
Figure 4B:
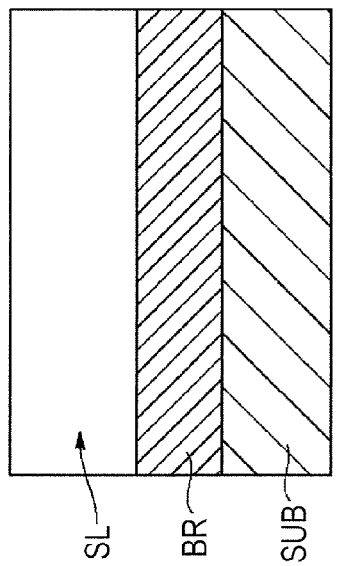
Figure 4A:
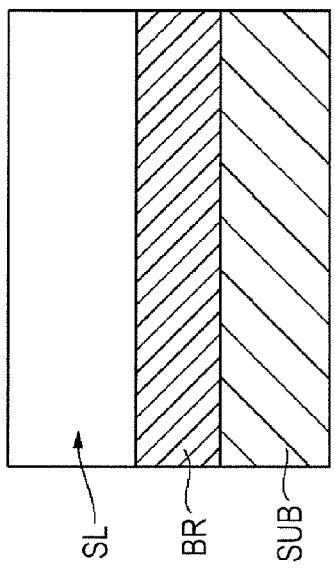

First, as shown in FIGS. 4A, 4B, and 4C, an N-type embedded region BR is formed by introducing an N-type impurity into the semiconductor substrate SUB before an offset region forming step described below (the embedded region forming step). Note that, as described above, the semiconductor substrate SUB is, for example, a P-type silicon substrate. Further, the N-type impurity is, for example, antimony (Sb).

After the embedded region forming step, the P-type semiconductor layer SL is epitaxially grown onto the semiconductor substrate SUB by the CVD method. The materials used here include, for example, monosilane ($SiH_4$) as silicon material and diborane ($B_2H_6$) as P-type impurity material.

Next, as shown in FIGS. 5A, 5B, and 5C, a photoresist layer (not shown) is formed on the semiconductor layer SL. The photoresist layer is selectively removed by exposure and development. Next, a P-type impurity is implanted into an implantation region (IR1), which will be the source offset region SOS and the drain offset region DOS in the semiconductor layer SL, by ion implantation with the particular photoresist layer as the mask. Further, an N-type impurity is implanted into an implantation region (IR2), which will be the N-type deep well region DWL of the semiconductor layer SL. The P-type impurity is, for example, boron (B). The N-type impurity is, for example, phosphorus (P). Next, the photoresist layer is removed by ashing. At this time, natural oxide film NO may be formed on the semiconductor layer SL.

Next, as shown in FIGS. 6A, 6B, and 6C, the P-type impurity and the N-type impurity are activated by the thermal process. At this time, the particular impurities are thermally diffused into the semiconductor layer SL.

In this way, the source offset region SOS and the drain offset region DOS are formed by introducing the P-type impurity into positions separated from each other in the semiconductor layer SL (so far is the offset region forming step).

Next, as shown in FIGS. 7A, 7B, and 7C, a field insulating film FIF is formed in at least a position between the source region SR and the drain region DR in the semiconductor layer SL in a plan view, before the groove portion forming step described below (the field insulating film forming step). For example, the field insulating film FIF is formed by the LOCOS process as follows. First, SiN film (not shown) is formed on the semiconductor layer SL. Next, the SiN film is selectively removed, so that only the region in which the SiN film where the source region SR and the drain region DR are formed, remains in a plan view. Then, thermal oxidation is performed. Next, the SiN film is removed. In this way, the field insulating film FIF is formed with an opening (no reference numeral) in the region in which the source region SR and the drain region DR are formed in the semiconductor layer SL in a plan view. The field insulating film FIF formed over the particular region except the opening.

Next, as shown in FIGS. 8A, 8B, and 8C, an oxide film (no reference numeral), a mask layer ML1, and a mask layer ML2 are formed on the semiconductor layer SL and on the field insulating film FIF. Preferably, the mask layers ML1 and ML2 are materials with a lower etching rate than that of the semiconductor layer SL under the condition of etching the semiconductor layer SL. More specifically, the mask layer ML1 is SiN, and the mask layer ML2 is $SiO_2$. By providing at least the mask layer ML1, it is possible to prevent the semiconductor layer SL1 from being oxidized in the gate insulating film forming step described below.

Next, the mask layers ML1 and ML2 are selectively removed to form an opening (not shown) in the region in which the groove portion GT is formed. The opening is formed in at least a position between the source offset region SOS and the drain offset region DOS in the semiconductor layer SL in a plan view. Further, the shape of the opening in a plan view is rectangular with the long side running from the source offset region SOS to the drain offset region DOS in a plan view. Next, the groove portion GT is formed, for example, by reactive ion etching (RIE) method with the mask layers ML1 and ML2 as the mask.

In this way, the groove portion GT is formed in at least a position between the source offset region SOS and the drain offset region DOS in the semiconductor layer SL in a plan view, in the direction from the source offset region SOS to the drain offset region DOS in a plan view (so far is the groove portion forming step).

In the groove portion forming step, the bottom of the groove portion GT enters the embedded region BR. In this way, it is possible to prevent the electric field from being concentrated in the area in which the bottom of the particular groove portion GT enters the embedded region BR as described above.

Further, in the groove portion forming step, the groove portion GT is formed within the field insulating film FIF in a plan view. In this way, it is possible to increase the breakdown voltage of the semiconductor device SD.

Next, as shown in FIGS. 9A, 9B, and 9C, the gate insulating film GI is formed on the side and the bottom of the groove portion GT (the gate insulating film forming step). Here, in the gate insulating film forming step, the gate insulating film GI is formed by thermally oxidizing the side and bottom of the groove portion GT. In this way, it is possible to form the gate insulating film GI without pin holes in a stable manner.

Figure 10C:
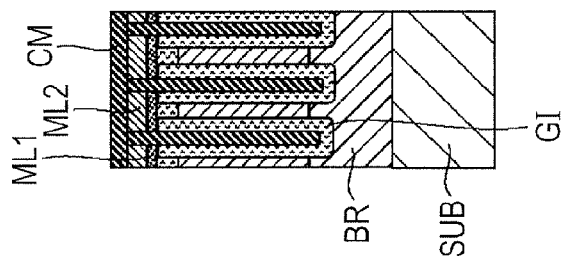
FIGS. 10A, 10B, and 10C are cross-sectional views showing a method of manufacturing the semiconductor device according to the first embodiment.
Figure 10B:
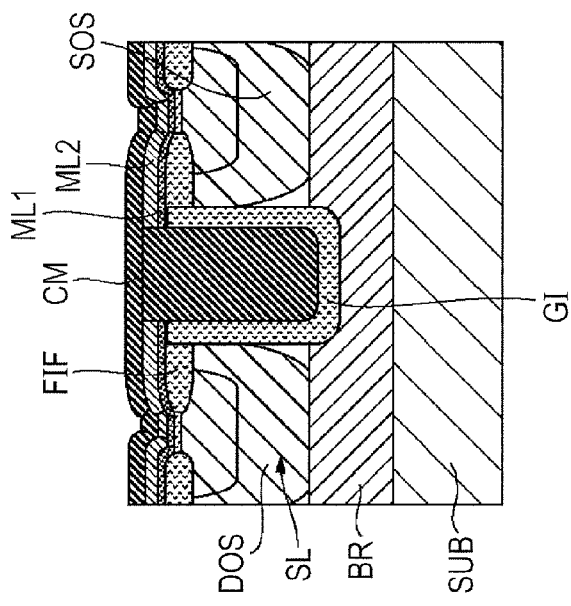
Figure 10A:
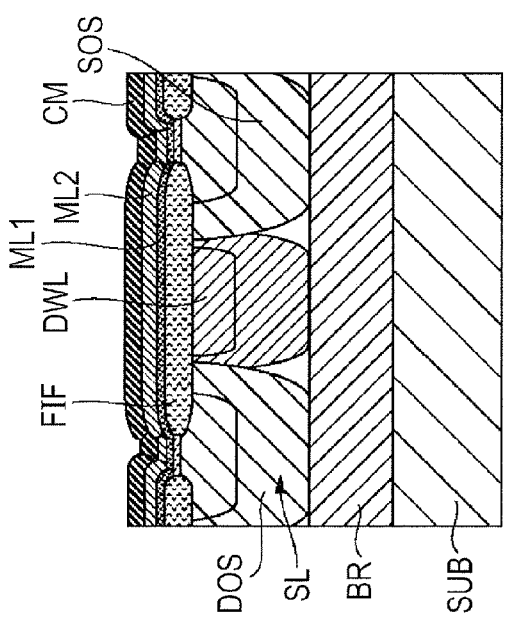

Next, as shown in FIGS. 10A, 10B, and 10C, the conductive material CM is formed on the semiconductor layer SL so as to contact the gate insulating film GI within the groove portion GT. Here, for example, polysilicon is formed as the conductive material CM by the CVD method. Note that it is desirable that the conductive material CM is formed to fully fill the groove portion GT.

Next, as shown in FIGS. 11A, 11B, and 11C, the surface layer of the conductive material MC is removed. In this way, the gate electrode GE is formed only within the groove portion GT in a plan view (the gate electrode forming step). Here, for example, in the gate electrode forming step, only the surface layer of the conductive material CM is thermally oxidized, and the oxidized surface layer is removed to form the gate electrode GE. In this way, since the oxidized surface layer of the gate electrode GE is removed, it is possible to reduce the contact resistance between the gate electrode GE and the contact via VA.

Next, the mask layer ML2 and the mask layer ML1 are removed, for example, by dry etching. Note that the mask layers ML2 and ML1 may also be removed by wet etching. Further it is also possible to remove the mask layers ML2 and ML1 by chemical mechanical polishing (CMP) and flatten the upper surface of the semiconductor layer SL.

Next, as shown in FIGS. 3A, 3B, and 3C, the P-type well region WL1, the source region SR, and the drain region DR are formed by introducing a P-type impurity with the field insulating film FIF, the gate insulating film GI, and the gate electrode GE as the mask.

Further, as shown in FIGS. 3A, 3B, and 3C, the interlayer insulating film IF1 is formed on the semiconductor layer SL, on the field insulating film FIF, and on the gate electrode GE, for example, by the CVD method. Next, a contact hole (not shown) is formed in a position overlapping the gate electrode GE, the source region SR, or the drain region DR in the interlayer insulating film IF1 in a plan view.

Next, a metal is formed on the interlayer insulating film IF1 and also within the contact hole. For example, the metal is Al. Next, the particular metal is selectively removed to form the contact via VA and the line IC1 integrally as a single piece. Note that it is also possible to form the contact via VA and the line IC1 by a damascene process.

Further, a plurality of line layers may be formed on the interlayer insulating layer IF1 and on the line IC1, to form a multilayer interconnection structure. For example, a bump electrode (not shown) or a Cu pillar (not shown) may be formed on the topmost layer of the multilayer interconnection structure.

Next, for example, TCP is formed with respect to the semiconductor device SD by the following steps. The semiconductor substrate SUB is diced into individual semiconductor chips. The semiconductor chip is mounted, for example, on a tape-shaped flexible wiring substrate (not shown). At this time, the bump electrode of the semiconductor chip is coupled to the line of the flexible substrate. Further, the semiconductor chip is sealed with a sealing resin.

As described above, the semiconductor device SD according to the first embodiment can be formed.

Next, the effect of the first embodiment will be described using a comparative example with reference to FIGS. 15 to 21. First described is the effect of providing the gate electrode GE only within the groove portion GT in a plan view.

Figure 15:
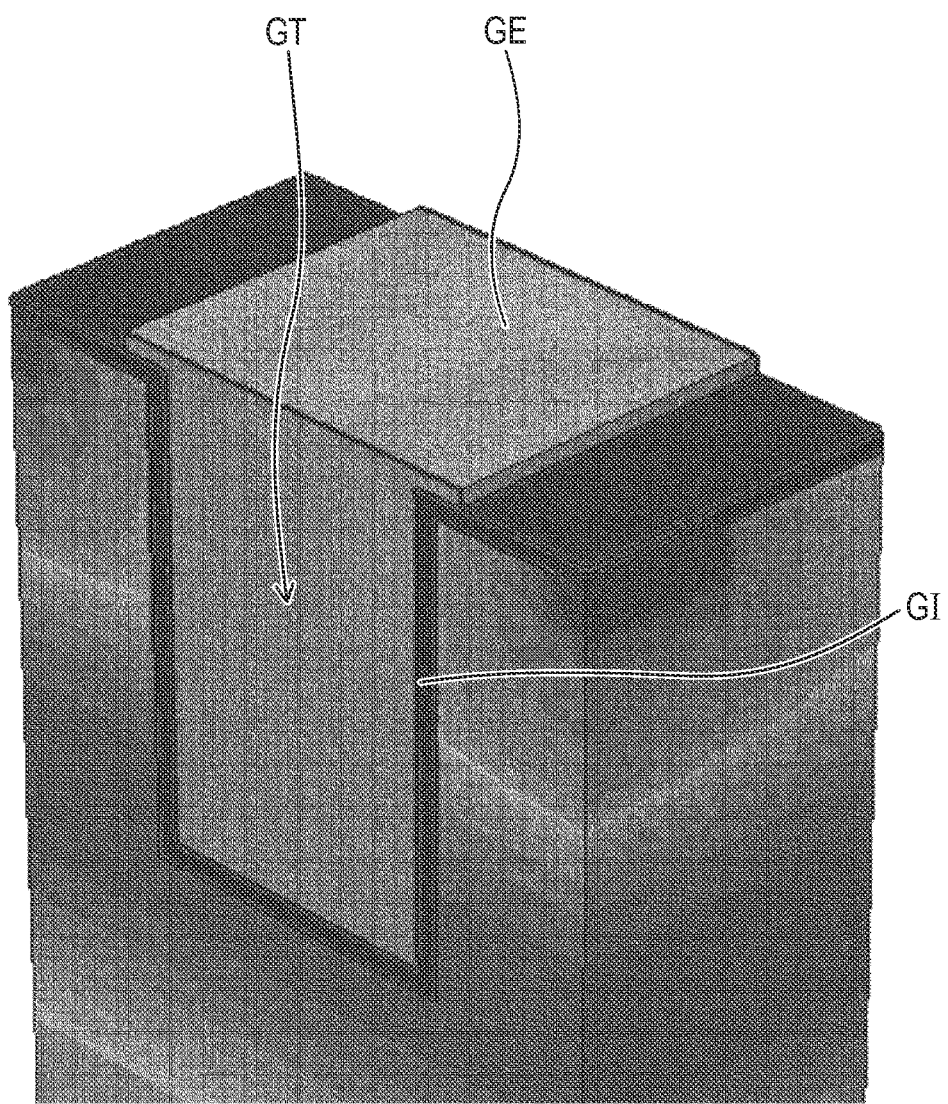
FIG. 15 is a perspective view of the structure of a semiconductor device in a comparative example.

FIG. 15 is a perspective view of the structure of the semiconductor device SD in a comparative example. As shown in FIG. 15, a first comparative example is the case where the gate electrode GE is integrally formed also on the outside of the groove portion GT in a plan view. In this case, the gate electrode GE is formed so as to extend over the surface of the semiconductor substrate SUB (the semiconductor layer SL) in a position overlapping the source offset region SOS and the drain offset region DOS in a plan view. For example, the gate electrode GE is also provided so as to extend over a plurality of groove portions GT in a plan view. In other words, in the comparative example, the region of the upper end of the semiconductor layer SL, which does not come into contact with the groove portion GT, also serves as a channel region.

Figure 16:
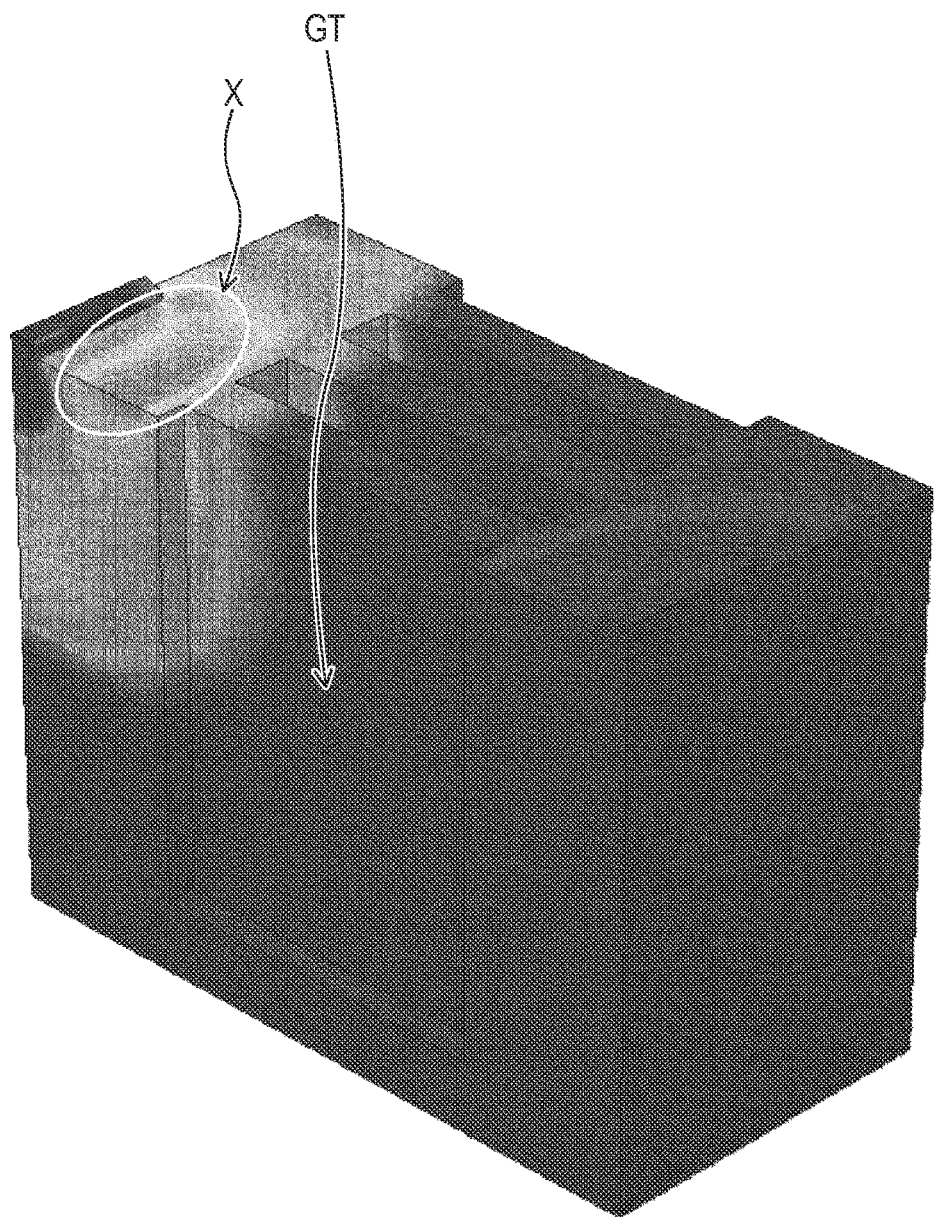
FIG. 16 is a view of the distribution of the electric field strength in a comparative example.

FIG. 16 is a view of the distribution of the electric field strength in the comparative example. In FIG. 16, the dark colored portion shows that the electric field strength is high. As shown in the X part of FIG. 16, the electric field strength is high in the vicinity of the upper end of the semiconductor layer SL in the first comparative example. In other words, the electric field is concentrated in the vicinity of the end of the gate electrode GE, in the vicinity of the upper end of the groove portion GT, for example, in the vicinity of the upper end of the groove portion GT and in the vicinity of the end of the gate electrode GE on the side of the drain region DR.

Figure 17:
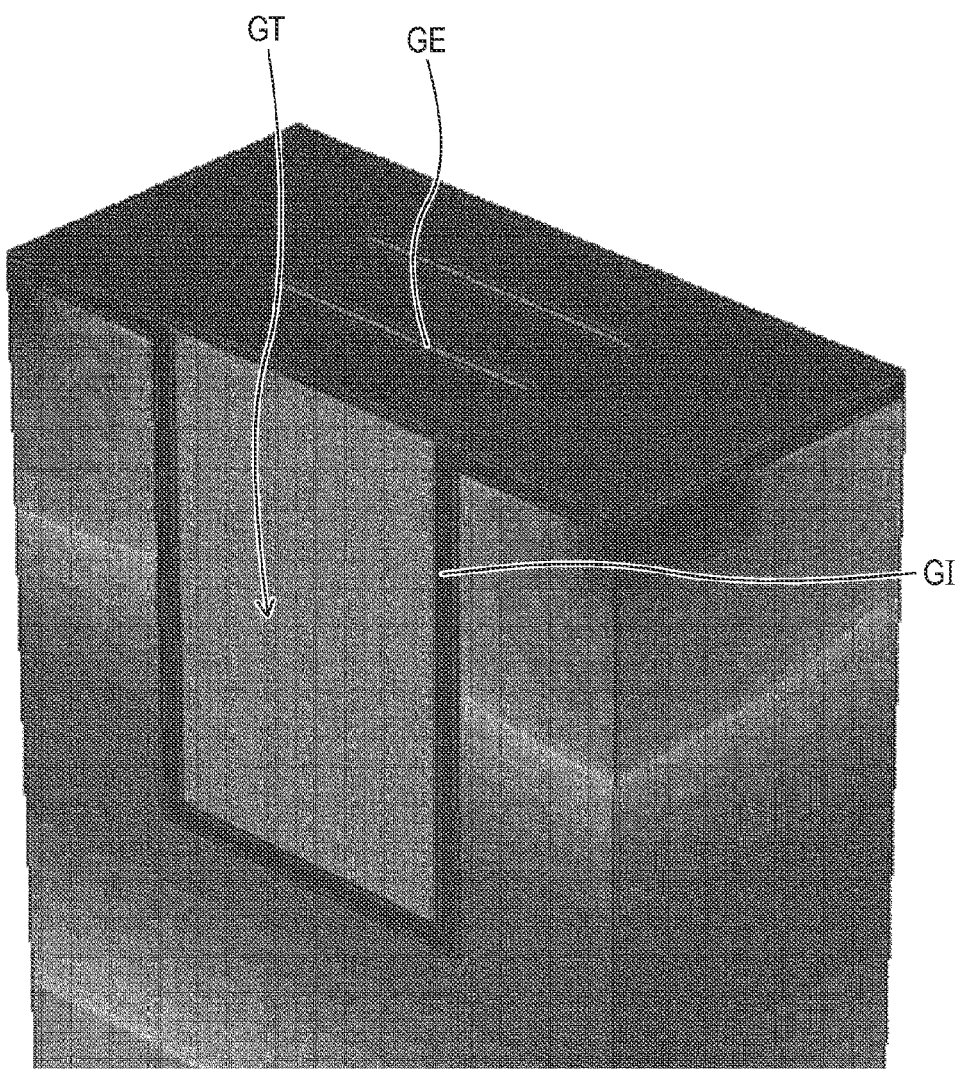
FIG. 17 is a perspective view of the structure of the semiconductor device according to the first embodiment.

On the other hand, FIG. 17 is a perspective view of the structure of the semiconductor device SD according to the first embodiment. As shown in FIG. 17, in the first embodiment, the gate electrode GE is provided only within the groove portion GT in a plan view.

Figure 18:
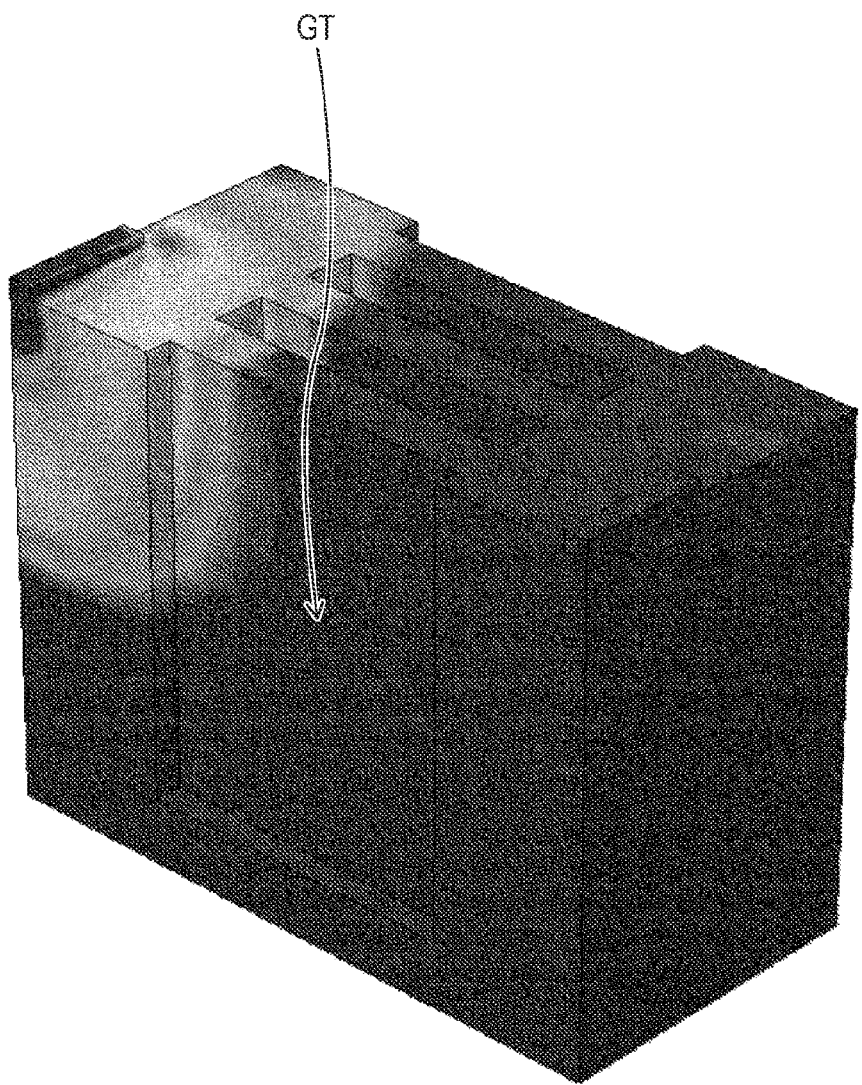
FIG. 18 is a view of the distribution of the electric field strength of the semiconductor device according to the first embodiment.

FIG. 18 is a view of the distribution of the electric field strength of the semiconductor device according to the first embodiment. As shown in FIG. 18, the electric field in the vicinity of the upper end of the semiconductor layer SL in the first embodiment is lower than that of the first comparative example. In the first embodiment, the area in which the electric field is high, such as the X part shown in the first comparative example, is not formed. In the first embodiment, the gate electrode GE does not stick out of the groove portion GT in a plan view. Thus, it is possible to prevent the electric field from being concentrated in the vicinity of the end of the gate electrode GE, in the vicinity of the upper end of the groove portion GT, for example, in the vicinity of the upper end of the groove portion GT and in the vicinity of the end of the gate electrode GE on the side of the drain region DR. Further, this is particularly effective for operation with a high voltage of 20 V or more.

Figure 19:
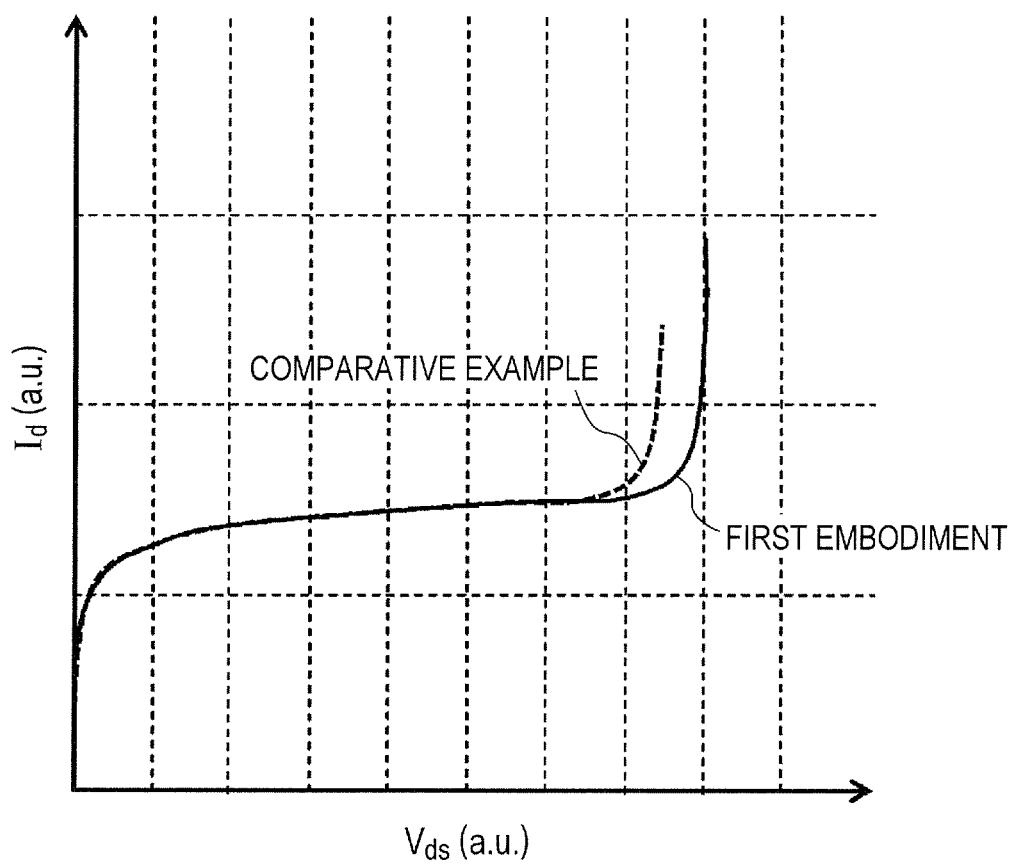
FIG. 19 is a graph showing the characteristics of $V_{ds}$-$I_d$ when $V_{gs}$=0.

FIG. 19 is a view of the characteristics of $V_{ds}$-$I_d$ (the drain-source voltage–the drain current) when $V_{gs}$ (the gate-source voltage)=0. In FIG. 19, the first comparative example is shown by the dotted line, and the first embodiment is shown by the solid line.

As shown in FIG. 19, when $V_{gs}$ (the gate-source voltage)=0 in the first embodiment, the drain-source breakdown voltage is higher than that of the comparative example. In other words, the voltage in the first embodiment is higher than the voltage in the first comparative example.

Figure 20A:
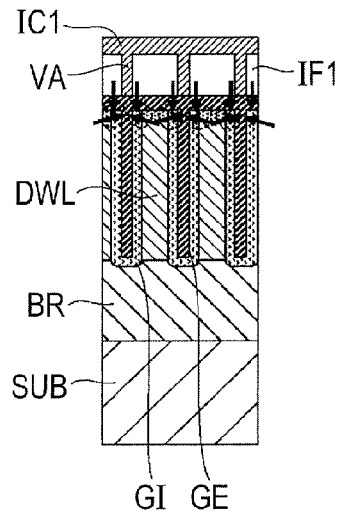
FIGS. 20A and 20B are cross-sectional views showing the effect of the first embodiment.
Figure 20B:
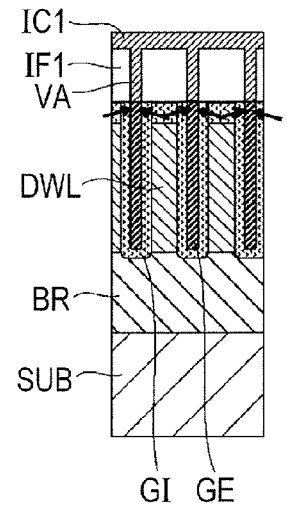

FIGS. 20A and 20B are cross-sectional views showing the effect of the first embodiment. FIGS. 20A and 20B are cross-sectional views taken along line C-C' in FIG. 2. The arrows in the FIGS. 20A and 20B indicate the direction of the electric field in the vicinity of the upper end of the groove portion GT. FIG. 20A is a cross-sectional view of the first comparative example shown in FIG. 15, and FIG. 20B is a cross-sectional view of the first embodiment. Note that in FIGS. 20A and 20B, the lower end side of the groove portion GT is, not taken into account to simplify the description.

FIG. 20A shows the first comparative example in which, similarly to FIG. 15, the gate electrode GE is integrally formed also on the outside of the groove portion GT in a plan view.

As shown in FIG. 20A, in the first comparative example, the electric fields from the upper surface of the semiconductor layer SL, and from the side surface of the groove portion GT are concentrated in the vicinity of the upper end of the groove portion GT. Thus, when $V_{gs}$ (the gate-source voltage)=0, the drain-source breakdown voltage is low in the first comparative example. In the first comparative example, the local $V_{th}$ in the vicinity of the upper end of the groove portion GT is lower than the other regions, so that stable characteristics may not easily be obtained. Note that in FIG. 20A, the electric field is reduced in the lower end of the groove portion GT as described below.

On the other hand, as shown in FIG. 20B, in the first embodiment, the gate electrode GE is provided only within the groove portion GT in a plan view. Thus, the electric field disappears or diminishes in the upper surface of the semiconductor layer SL. In this way, the electric field is reduced in the vicinity of the upper end of the groove portion GT.

Further, in the first embodiment, the bottom of the groove portion GT enters the embedded region BR. The effect of this is as follows.

Figure 21A:
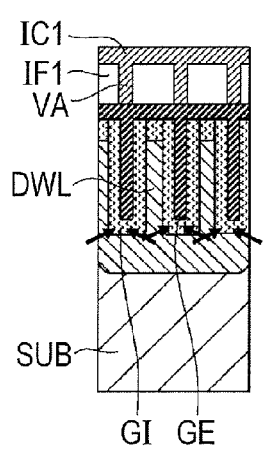
FIGS. 21A, 21B, and 21C are cross-sectional views showing the effect of the first embodiment.
Figure 21B:
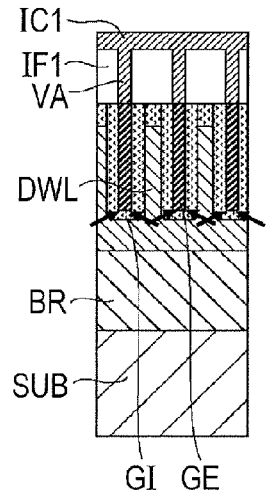
Figure 21C:
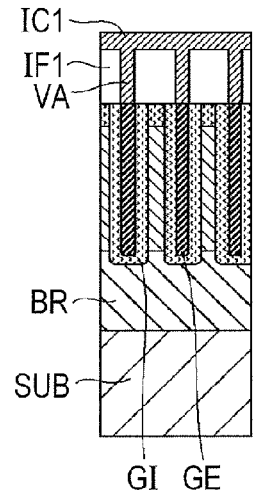
Figure 23C:
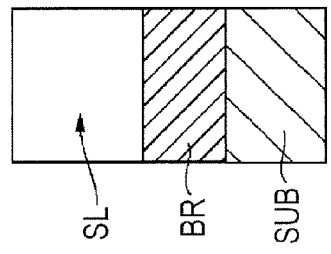
FIGS. 23A, 23B, and 23C are cross-sectional views showing a method of manufacturing the semiconductor device according to the second embodiment.
Figure 23B:
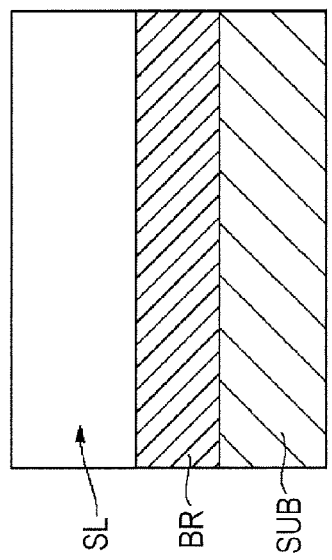
Figure 23A:
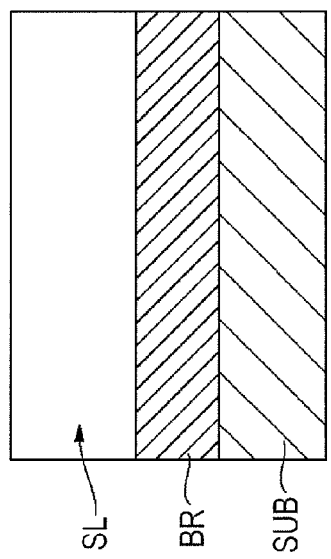

FIGS. 21A, 21B, and 21C are cross-sectional views showing the effect of the first embodiment. FIGS. 21A, 21B, and 21C are cross-sectional views taken along line C-C' of FIG. 2, similar to FIGS. 20A and 20B. The arrows of the FIGS. 21A, 21B, and 21C show the direction of the electric field in the vicinity of the lower end of the groove portion GT. FIG. 21A is a cross-sectional view of a second comparative example, FIG. 21B is a cross-sectional view of a third comparative view, and FIG. 21C is a cross-sectional view of the first embodiment. Note that the upper end of the groove portion GT is not taken into account to simplify the description.

FIG. 21A shows the second comparative example in which the gate electrode GE is integrally formed also on the outside of the groove portion GT in a plan view, and in which the embedded region BR is not formed. In other words, the gap between the groove portions GT is covered by the gate electrode GE. Further, FIG. 21B is the third comparative example in which the gate electrode GE is formed only within the groove portion GT, and in which the bottom of the groove portion GT is disposed above the embedded region BR.

As shown in FIGS. 21A and 21B, in the second and third comparative examples, the region in the vicinity of the bottom of the groove portion GT is also the channel region. For this reason, an electric field is generated in the vicinity of the lower end of the groove portion GT. Thus, the local $V_{th}$ in the vicinity of the lower end of the groove portion GT is lower than the other regions, so that stable characteristics may not easily be obtained. Note that the electric field is reduced in the upper end of the groove portion GT as described above in FIG. 21B.

On the other hand, as shown in FIG. 21C, in the first embodiment, the bottom of the groove portion GT enters the embedded region BR. In this way, the area in which the bottom of the groove portion GT enters the embedded BR does not function as the P-type channel region. For this reason, it is possible to prevent the electric field from being concentrated in the area in which the bottom of the groove portion GT enters the embedded region BR.

As described above, according to the first embodiment, it is possible to provide a semiconductor device SD designed to prevent the electric field from being concentrated in the vicinity of the end (upper end or lower end) of the groove portion GT.

Second Embodiment

FIGS. 22A, 22B, and 22C are cross-sectional views of the structure of a semiconductor device SD according to a second embodiment of the present invention. The second embodiment is the same as the first embodiment, except the field insulting film FIF is not provided between the source region SR and the drain region DR in a plan view. The details of the second embodiment will be described below.

FIG. 22A is a cross-sectional view taken along line A-A' in FIG. 2. FIG. 22B is a cross-sectional view taken along line B-B' in FIG. 2. FIG. 22C is a cross-sectional view taken along line C-C' in FIG. 2.

As shown in FIGS. 22A, 22B, and 22C, the field insulating film FIF may not be provided between the source region SR and the drain region DR in a plan view. Here, an opening (no reference numeral) of the field insulating film FIF is formed in the area including the groove portion GT, the source region SR, and the drain region DR in a plan view. The particular field insulating film FIF is the so-called element separation region.

Further, as shown in FIG. 22B, both the source region SR and the drain region DR contact the gate insulating film GI.

Next, a method of manufacturing the semiconductor device SD according to the second embodiment will be described with reference to FIGS. 23A to 30C. FIGS. 23A to 30C are cross-sectional views showing a method of manufacturing the semiconductor device SD according to the second embodiment.

As shown in FIGS. 23A to 25C, the embedded region forming step and the offset region forming step are performed in a similar way to the first embodiment.

Next, as shown in FIGS. 26A, 26B, and 26C, the field insulating film forming step is performed as follows before the groove portion forming step. First, SiN film (not shown) is formed on the semiconductor layer SL. Next, the SiN film is selectively removed, so that the region in which the groove portion GT, the N-type deep sell region DWL, the source region SR, and the drain region DR are formed (namely, the FET forming region) remains in a plan view. Next, thermal oxidation is performed. Then, the SiN film is removed. In this way, the field insulating film FIF having an opening (no reference numeral) is formed in the region of the semiconductor layer SL in which the FET is formed in a plan view.

Next, as shown in FIGS. 27A, 27B, and 27C, an oxide film (no reference numeral), as well as mask layers ML1 and LM2 are formed on the semiconductor layer SL and the field insulating film FIF. Next, the mask layers ML1 and ML2 are selectively removed to form an opening (not shown) in the region in which the groove portion GT is formed. Next, the groove portion GT is formed with the mask layers ML1 and ML2 as the mask.

Next, as shown in FIGS. 28A, 28B, and 28C, the gate insulating film GI is formed on the side and bottom of the groove portion GT, for example, by thermal oxidization.

Figure 29C:
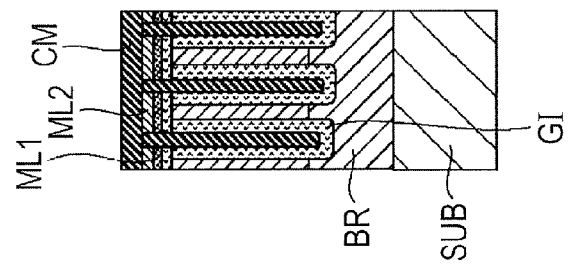
FIGS. 29A, 29B, and 29C are cross-sectional views showing a method of manufacturing the semiconductor device according to the second embodiment.
Figure 29B:
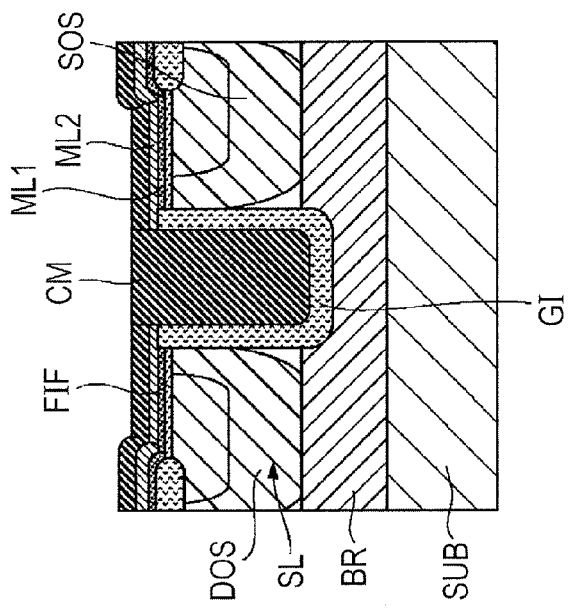
Figure 29A:
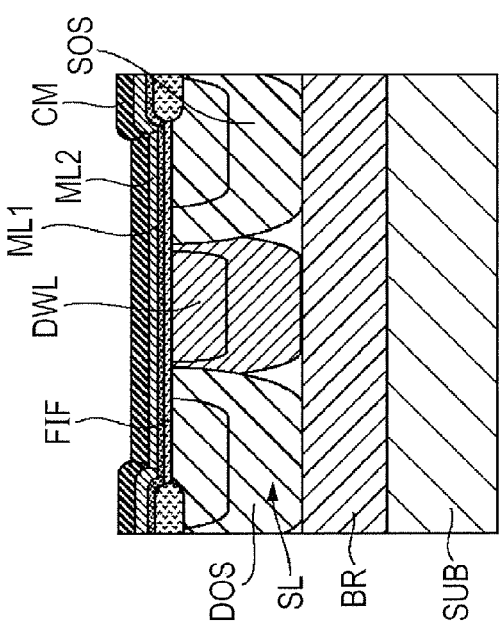

Next, as shown in FIGS. 29A, 29B, and 29C, a conductive material CM is formed on the semiconductor layer SL, so as to contact the gate insulating film GI within the groove portion GT.

Next, as shown in FIGS. 30A, 30B, and 30C, the surface layer of the conductive material CM is removed. In this way, the gate electrode GE is formed only within the groove portion GT in a plan view.

Next, as shown in FIGS. 22A, 22B, and 22C, the P-type well region WL1, the source region SR, and the drain region DR are formed by introducing a P-type impurity by using the field insulating film FIF, the gate insulating film GI, and the gate electrode GE as the mask.

The following steps are the same as those in the first embodiment.

According to the second embodiment, it is possible to obtain the same effect as the first embodiment. According to the second embodiment, the field insulating film FIF may not be provided between the source region SR and the drain region DR in a plan view. In this way, it is possible to provide a semiconductor device SD with high breakdown voltage and low ON resistance.

Third Embodiment

A third embodiment is the same as the first embodiment, except the first conductivity type is N type and the second conductivity type is P type. The cross sectional views of the semiconductor device SD are the same as FIGS. 1 to 3. The details of the third embodiment will be described below.

The semiconductor device SD according to the third embodiment includes an N-type semiconductor layer SL, an N-type well region WL1, a P-type well region WL2, an N-type source region SR, an N-type drain region DR, an N-type source offset region SOS, an N-type drain offset region DOS, a groove portion GT, a gate insulating film GI, a gate electrode GE, and a P-type embedded region BR. In other words, the semiconductor device SD according to the third embodiment may be an n-channel FET.

The P-type embedded region BR is provided in the semiconductor substrate SUB. The P-type impurity introduced into the embedded region BR is, for example, boron (B).

According to the third embodiment, it is possible to obtain the same effect as the first embodiment.

Fourth Embodiment

Figure 31:
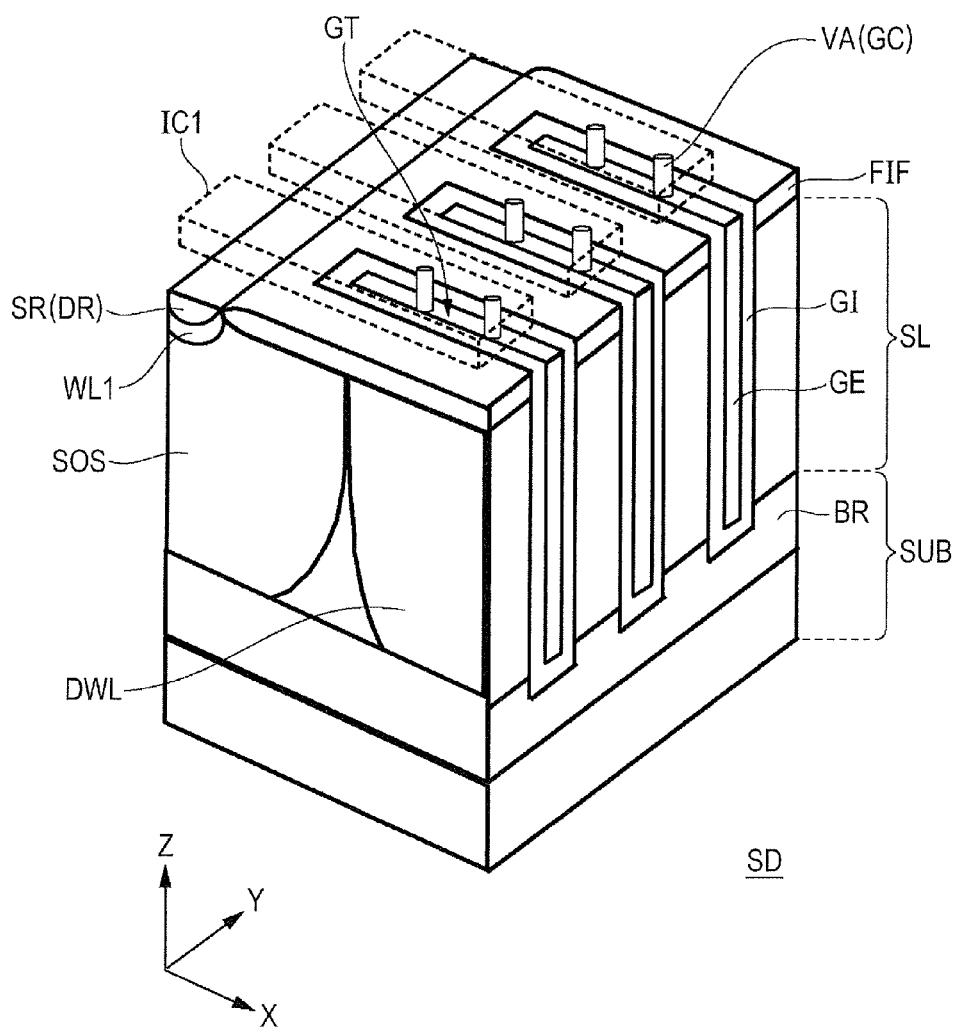
FIG. 31 is a perspective view of the structure of a semiconductor device according to a fourth embodiment.

FIG. 31 is a perspective view of the structure of a semiconductor device SD according to a fourth embodiment of the present invention. The fourth embodiment is the same as the first embodiment, except the layout of the line IC1 coupled to the gate electrode GE is different. The details of the fourth embodiment will be described below.

As shown in FIG. 31, the line IC1 coupled to the gate electrode GE may also be provided in the direction (X direction) from the source region SR to the drain region DR. In other words, the line IC1 is provided so as to extend in the direction parallel to the longitudinal direction of the groove portion GT.

Further, the line IC1 coupled to the gate electrode GE is separated in a position overlapping the channel region in a plan view. In the fourth embodiment, the area of the particular line IC1 that overlaps the channel region in a plan view is smaller than that of the first embodiment.

Note that in the fourth embodiment, the source region SR and the drain region DR are coupled to a line (not shown) disposed above the line IC1 through a via (not shown) provided in the region not shown.

According to the fourth embodiment, it is possible to obtain the same effect as the first embodiment.

Here, when the line IC1 coupled to the gate electrode GE is provided in a position overlapping the channel region in a plan view, the electric field of the channel region may be affected by the line IC1. For example, similarly to the case where the gate electrode GE covers the gap between the groove portions GT, the electric field may be concentrated in the vicinity of the upper end of the groove portion GT.

On the other hand, according to the fourth embodiment, the line IC1 coupled to the gate electrode GE is provided so as to extend in the direction parallel to the longitudinal direction of the groove portion GT. In this way, it is possible to prevent the electric field of the channel region from being affected by the potential of the line IC1.

In the above embodiments, the gate electrode GE is provided only within the groove portion GT in a plan view, and the bottom of the groove portion GT enters the embedded region BR. However, it is enough that the semiconductor device SD includes either one of the structures. In other words, it is possible that the gate electrode GE is provided only within the groove portion GT in a plane view, and that the bottom of the groove portion GT does not enter the embedded region BR. Further, it is also possible that the gate electrode GE is provided on the outside of the groove portion GT in a plan view, and that the bottom of the groove portion GT enters the embedded region BR. In this way, it is possible to provide a semiconductor device designed to prevent the electric field from being concentrated in the vicinity of the upper or lower end of the groove portion.

In the above embodiments, it is assumed that the gate electrode GE is polysilicon. However, the gate electrode GE may also be a metal or a metal silicide. Further, it is assumed that the gate insulating film GI is thermal oxide silicon, but other insulating films may also be used.

In the above embodiments, the gate electrode GE is provided only within the groove portion GT in a plan view. However, the present invention is not limited to the exemplary embodiments. It is also possible to employ a structure in which at least the region of the gate electrode GE on the side of the drain region DR is formed within the groove portion GT. In other words, it is possible that the region of the gate electrode GE on the side of the source region SR is formed on the outside of the groove portion GT.

While the invention made by the inventors has been described in detail with reference to the preferred embodiments, it will be understood that the present invention is not limited to the embodiments and various modifications and changes may be made thereto without departing from the spirit and scope of the invention.

Note that in the above embodiments, the following invention is also disclosed.

(Appendix 1)

A method of manufacturing a semiconductor device including: an offset region forming step of forming a source offset region and a drain offset region by introducing an impurity of a first conductivity type in positions separated from each other in a semiconductor layer; a groove portion forming step of forming a groove portion in at least a position between the source offset region and the drain offset region in the semiconductor layer in a plan view, in a direction from the source offset region to the drain offset region in a plan view; a gate insulating film forming step of forming a gate insulating film on the side and bottom of the groove portion; a gate electrode forming step of forming a gate electrode only within the groove portion in a plan view, by forming a conductive material over the semiconductor layer so that the conductive material contacts the gate insulating film within the groove portion, and by removing a surface layer of the conductive material; and a source drain region forming step of forming a source region and a drain region by introducing an impurity of the first conductivity type with a higher concentration than those of the source offset region and the drain offset region, in a position contacting the source offset region of the semiconductor substrate, and in a position contacting the drain region and separated from the source offset region, respectively.

(Appendix 2)

The manufacturing method of the semiconductor device described in Appendix 1, further including an embedded region forming step of forming an embedded region of a second conductivity type opposite the first conductivity type in a position deeper than the source region and the drain region, before the offset region forming step. In the groove portion forming step, the bottom of the groove portion enters the embedded region.

(Appendix 3)

A method of manufacturing a semiconductor device including: an offset region forming step of forming a source offset region and a drain offset region by introducing an impurity of a first conductivity type in positions separated from each other in a semiconductor layer; a groove portion forming step of forming a groove portion in at least a position between the source offset region and the drain offset region in the semiconductor layer in a plan view, in the direction from the source offset region to the drain offset region in a plan view; a gate insulating film forming step of forming a gate insulating film on the side and bottom of the groove portion; a gate electrode forming step of forming a gate electrode by forming a conductive material over the semiconductor layer so that the conductive material contacts the gate insulating film within the groove portion, and by removing the surface layer of the conductive material; and a source drain region forming step of forming a source region and a drain region by introducing an impurity of the first conductivity type with a higher concentration than that of the source offset region, in a position contacting the source offset region of the semiconductor layer, and in a position contacting the drain region and separated from the source offset region, respectively. The manufacturing method further includes an embedded region forming step of forming an embedded region, of a second conductivity type opposite the first conductive type, in a position deeper than the source region and the drain region, before the offset region forming step. In the groove portion forming step, the bottom of the groove portion enters the embedded region.

(Appendix 4)

In the manufacturing method of the semiconductor device described in Appendix 2, the embedded region is formed in the embedded region forming step. The manufacturing method further includes a step of epitaxially growing the semiconductor layer over the semiconductor substrate after the embedded region forming step.

(Appendix 5)

The manufacturing method of the semiconductor device described in Appendix 1, further including a field insulating film forming step of forming a field insulating film between the source region and the drain region in the semiconductor layer in a plan view, before the groove portion forming step. In the groove portion forming step, the groove portion is formed within the field insulating film in a plan view.

(Appendix 6)
In the manufacturing method of the semiconductor device described in Appendix 5, in the field insulating film forming step, an opening is formed in the region in which the source region and the drain region are formed in the field insulating film. Then, in the source drain region forming step, the source region and the drain region are formed in the opening by using the gate insulating film, the gate electrode, and the field insulating film as the mask.

(Appendix 7)
In the manufacturing method of the semiconductor device described in Appendix 1, in the gate insulating film forming step, the gate insulating film is formed by thermally oxidizing the side and bottom of the groove portion.

(Appendix 8)
In the manufacturing method of the semiconductor device described in Appendix 1, in the gate electrode forming step, the gate electrode is formed by thermally oxidizing only the surface layer of the conductive material and by removing the oxidized surface layer.

What is claimed is:

1. A semiconductor device comprising:
a semiconductor layer;
source and drain regions of a first conductivity type that are provided separately from each other in the semiconductor layer;
a source offset region of the first conductivity type that is formed to contact the source region of the semiconductor layer via a first well region of the first conductivity type, with a lower concentration than those of the source region and the drain region;
a drain offset region of the first conductivity type that is formed to contact the drain region of the semiconductor layer via a second well region of the first conductivity type while being separated from the source offset region, with a lower concentration than those of the source region and the drain region;
a groove portion provided in at least a position between the source offset region and the drain offset region in the semiconductor layer in a plan view, in a direction from the source offset region to the drain offset region in a plan view;
a gate insulating film that covers a side and a bottom of the groove portion;
a gate electrode that is provided only within the groove portion in a plan view and contacts the gate insulating film; and
an embedded region of a second conductivity type opposite the first conductivity type that is located deeper than the source region and the drain region,
wherein the source region is surrounded by the source offset region in a plan view, and the drain region is surrounded by the drain offset region in a plan view.

2. The semiconductor device according to claim 1, wherein the bottom of the groove portion enters the embedded region.

3. A semiconductor device comprising:
a semiconductor layer;
source and drain regions of a first conductivity type that are provided separately from each other in the semiconductor layer;
a source offset region of the first conductivity type that is formed to contact the source region of the semiconductor layer via a first well region of the first conductivity type, with a lower concentration than those of the source region and the drain region;
a drain offset region of the first conductivity type that is formed to contact the drain region of the semiconductor layer via a second well region of the first conductivity type while being separated from the source offset region, with a lower concentration than those of the source region and the drain region;
a groove portion provided in at least a position between the source offset region and the drain offset region in the semiconductor layer in a plan view, in a direction from the source offset region to the drain offset region in a plan view;
a gate insulating film that covers a side and a bottom of the groove portion;
a gate electrode that is provided only within the groove portion in a plan view and contacts the gate insulating film; and
an embedded region of a second conductivity type opposite the first conductivity type that is located deeper than the source region and the drain region,
wherein the bottom of the groove portion enters the embedded region, and
wherein the source region is surrounded by the source offset region in a plan view, and the drain region is surrounded by the drain offset region in a plan view.

4. The semiconductor device according to claim 1, further comprising
a field insulating film between the source region and the drain region in the semiconductor layer in a plan view,
wherein the groove portion is provided within the field insulating film in a plan view.

5. The semiconductor device according to claim 4, wherein the field insulating film is formed by a local oxidation of silicon (LOCOS) process.

6. The semiconductor device according to claim 1, wherein a plurality of the groove portions are provided in a first direction perpendicular to a second direction from the source region to the drain region.

7. The semiconductor device according to claim 1, wherein the semiconductor layer is formed by epitaxial growth over a semiconductor substrate, and
wherein the embedded region is formed in at least a deep position from an upper surface of the semiconductor substrate.

8. The semiconductor device according to claim 7, wherein the bottom of the groove portion is formed in a deep position from the upper surface of the semiconductor substrate.

9. The semiconductor device according to claim 1, further comprising:
a deep well region of the second conductivity type,
wherein the deep well region is provided in at least a position between the source offset region and the drain offset region in the semiconductor layer in a plan view, in a position overlapping the groove portion in a cross-sectional view, and
wherein the embedded region of the second conductivity is formed with a higher concentration than that of the deep well region of the second conductivity type.

10. The semiconductor device according to claim 1, wherein the gate insulating film includes a thermal silicon oxide film.

11. The semiconductor device according to claim 1, wherein the gate electrode includes polysilicon.

12. The semiconductor device according to claim 1, wherein the embedded region is of N-type and includes Sb.

13. The semiconductor device according to claim 1, wherein the embedded region is of P-type and includes B.

14. The semiconductor device according to claim 1, comprising:
- a first transistor including the source region, the drain region, the source offset region, the drain offset region, and the gate insulating film and the gate electrode that are provided in the groove portion; and
- a second transistor,
- wherein the second transistor includes:
  - a second source and drain regions of a first conductivity type or a second conductivity type, which are provided separately from each other in the semiconductor layer;
  - a second gate insulating film provided over a position between the second source region and the second drain region; and
  - a second gate electrode provided over the second gate insulating film, and
- wherein the second transistor is provided in the same semiconductor layer as the first transistor, in a position different from the position of the first transistor in a plan view.

15. The semiconductor device according to claim 1,
- wherein a portion of the source offset region is interposed between the source region and the gate insulating film, and a portion of the drain offset region is interposed between the drain region and the gate insulating film.

16. The semiconductor device according to claim 1,
- wherein the source and drain regions contact the gate insulating film.

* * * * *